(12) United States Patent
Maeda

(10) Patent No.: US 11,322,212 B2
(45) Date of Patent: May 3, 2022

(54) SEMICONDUCTOR MEMORY DEVICE AND ERASE VERIFY OPERATION

(71) Applicant: KIOXIA CORPORATION, Minato-ku (JP)

(72) Inventor: Takashi Maeda, Kamakura (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 17/014,695

(22) Filed: Sep. 8, 2020

(65) Prior Publication Data

US 2020/0402597 A1 Dec. 24, 2020

Related U.S. Application Data

(63) Continuation of application No. 16/281,293, filed on Feb. 21, 2019, now Pat. No. 10,803,965.

(30) Foreign Application Priority Data

Sep. 14, 2018 (JP) .............................. JP2018-172214

(51) Int. Cl.
*G11C 11/22* (2006.01)
*G11C 16/34* (2006.01)
*G11C 16/16* (2006.01)
*G11C 16/12* (2006.01)
*G11C 11/56* (2006.01)
(Continued)

(52) U.S. Cl.
CPC .......... *G11C 16/3445* (2013.01); *G11C 5/147* (2013.01); *G11C 7/06* (2013.01); *G11C 7/1039* (2013.01); *G11C 11/223* (2013.01); *G11C 11/5635* (2013.01); *G11C 11/5657* (2013.01); *G11C 16/0483* (2013.01); *G11C 16/12* (2013.01); *G11C 16/16* (2013.01); *G11C 2211/5648* (2013.01)

(58) Field of Classification Search
CPC . G11C 16/0483; G11C 16/3445; G11C 16/12; G11C 16/16
See application file for complete search history.

(56) References Cited

U.S. PATENT DOCUMENTS 6,411,548 B1 6/2002 Sakui et al.
8,953,359 B2 2/2015 Shuto et al.
(Continued)

FOREIGN PATENT DOCUMENTS

JP 2001-024163 1/2001
JP 2009-266349 11/2009
(Continued)

*Primary Examiner* — Alfredo Bermudez Lozada
(74) *Attorney, Agent, or Firm* — Oblon, McClelland, Maier & Neustadt, L.L.P.

(57) ABSTRACT

A semiconductor memory device according to an embodiment includes a string, a bit line, a well line, and a sequencer. The string includes first and second select transistors, and memory cell transistors using a ferroelectric material. The bit line and the well line are connected to the first and second select transistors, respectively. At a time in an erase verify operation, the sequencer is configured to apply a first voltage to the memory cell transistors, to apply a second voltage lower than the first voltage to the first select transistor, to apply a third voltage lower than the first voltage to the second select transistor, to apply a fourth voltage to the bit line, and to apply a fifth voltage higher than the fourth voltage to the well line.

19 Claims, 27 Drawing Sheets

(51) Int. Cl.
    *G11C 16/04*     (2006.01)
    *G11C 5/14*     (2006.01)
    *G11C 7/10*     (2006.01)
    *G11C 7/06*     (2006.01)

(56) References Cited

U.S. PATENT DOCUMENTS

| | | |
|---|---|---|
| 9,147,481 B2 | 9/2015 | Kamata |
| 9,330,763 B1 * | 5/2016 | Zhang .................... G11C 16/26 |
| 9,570,173 B2 | 2/2017 | Yoshihara et al. |
| 10,210,921 B1 * | 2/2019 | Hwang ............... G11C 11/2259 |
| 2009/0268521 A1 | 10/2009 | Ueno et al. |
| 2015/0049553 A1 | 2/2015 | Maejima |
| 2015/0235689 A1 | 8/2015 | Kawashima |
| 2016/0189777 A1 * | 6/2016 | Yoshihara ............... G11C 16/26 |
| | | 365/185.17 |
| 2017/0117290 A1 * | 4/2017 | Lee .................... G11C 16/0483 |
| 2019/0123061 A1 | 4/2019 | Liu |

FOREIGN PATENT DOCUMENTS

| | | |
|---|---|---|
| JP | 2013-232258 | 11/2013 |
| JP | 2015-036998 | 2/2015 |
| JP | WO 2015/037416 A1 | 3/2015 |
| JP | 5902111 | 4/2016 |
| JP | 6221806 | 11/2017 |

\* cited by examiner

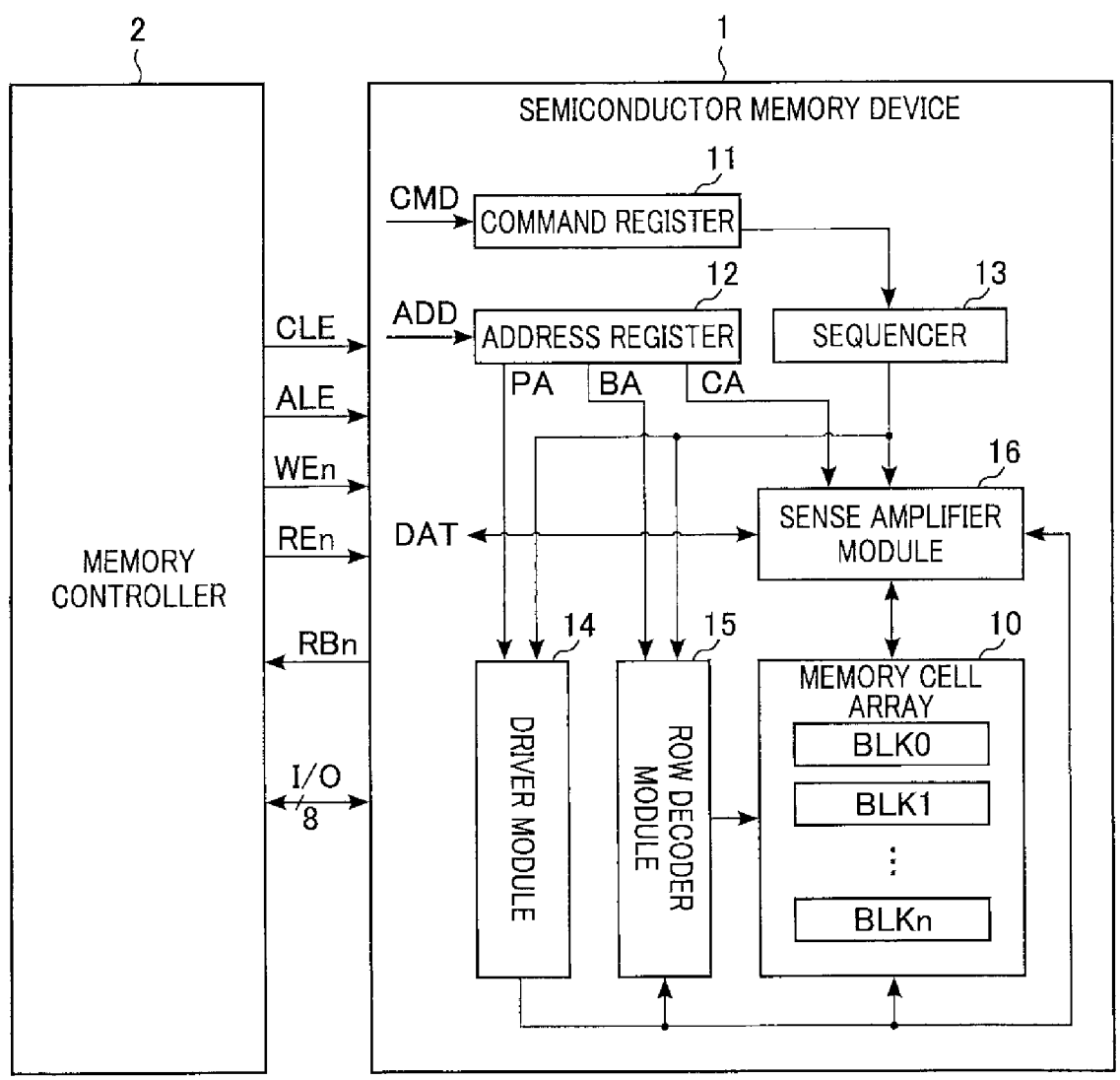
F I G. 1

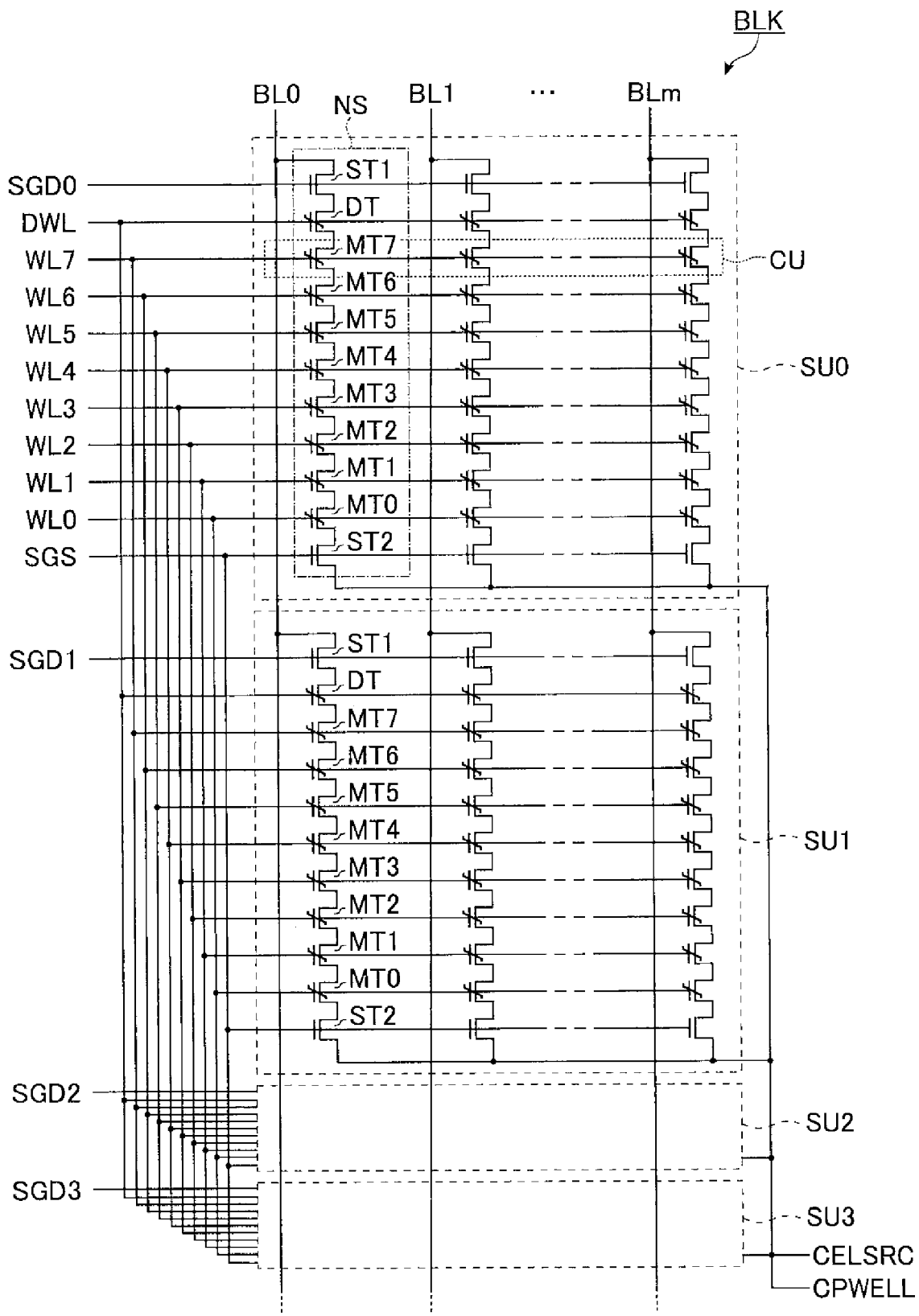
F I G. 2

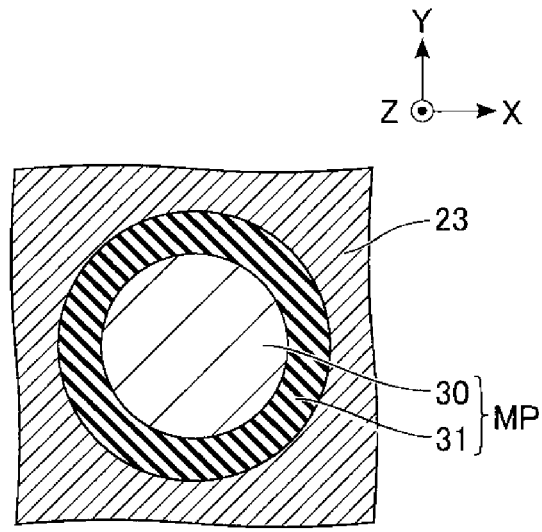
F I G. 4
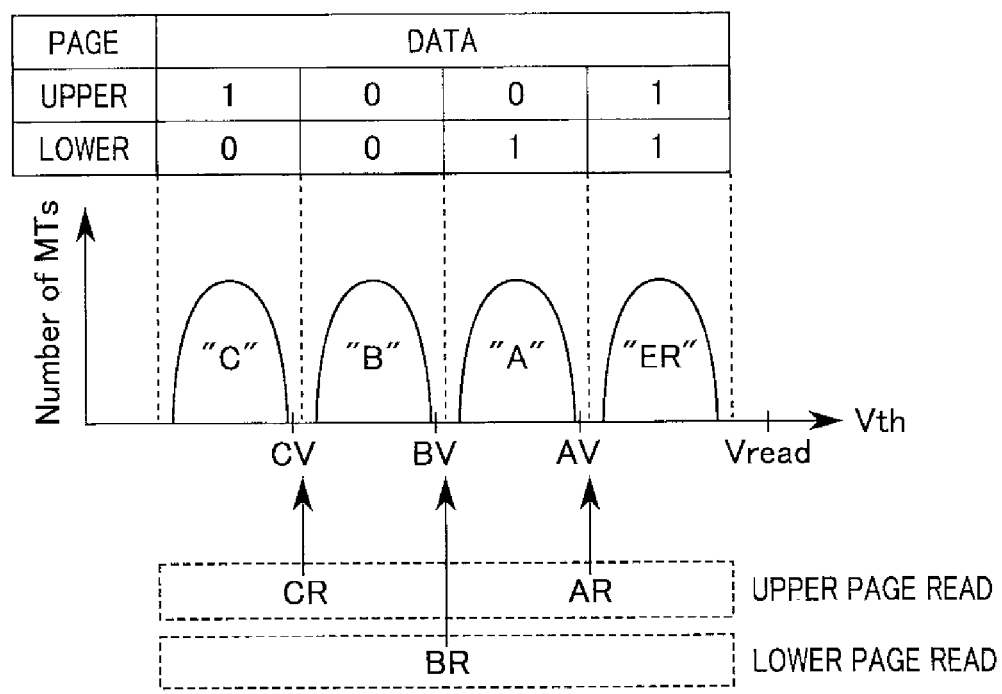
F I G. 5

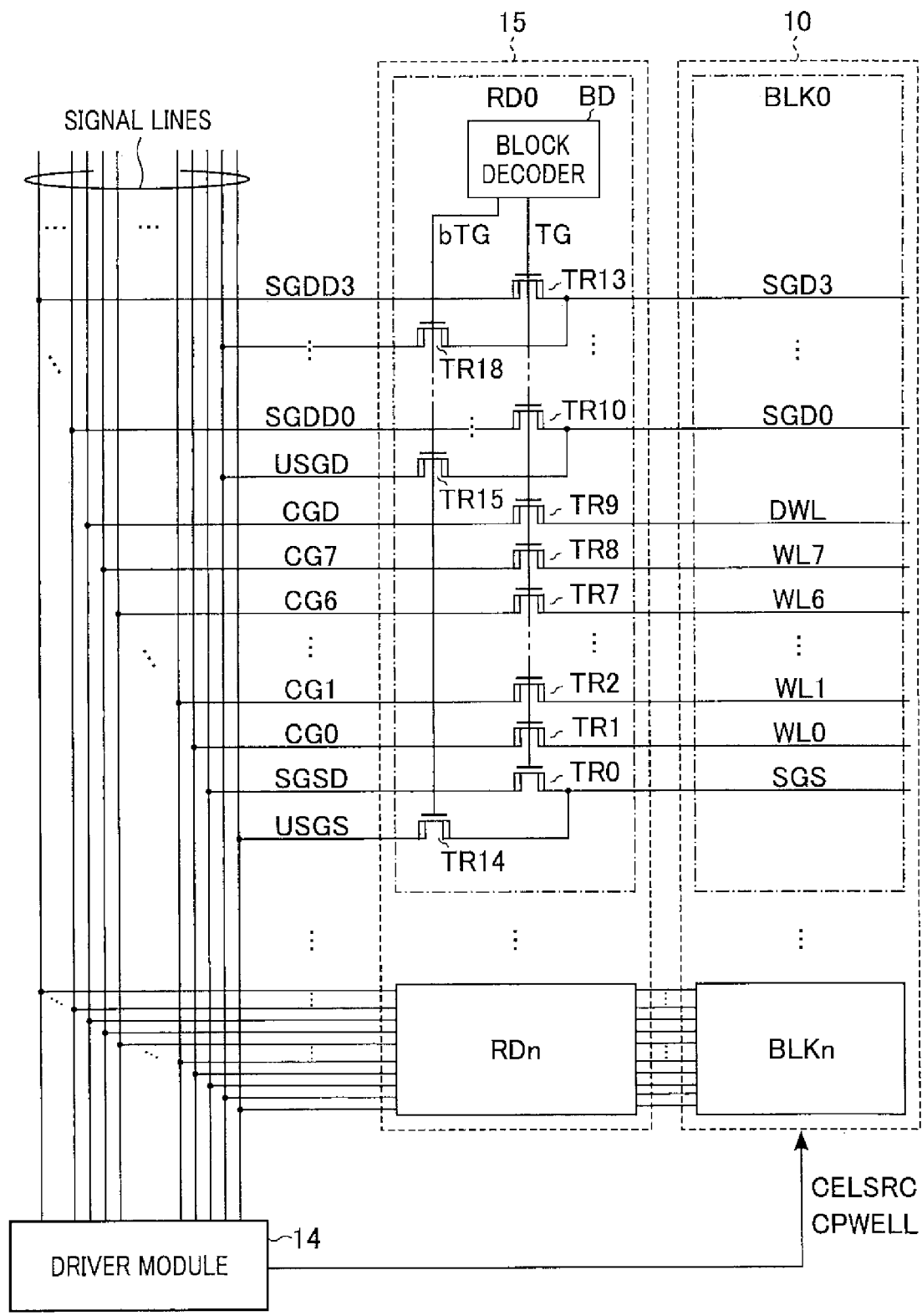
F I G. 6

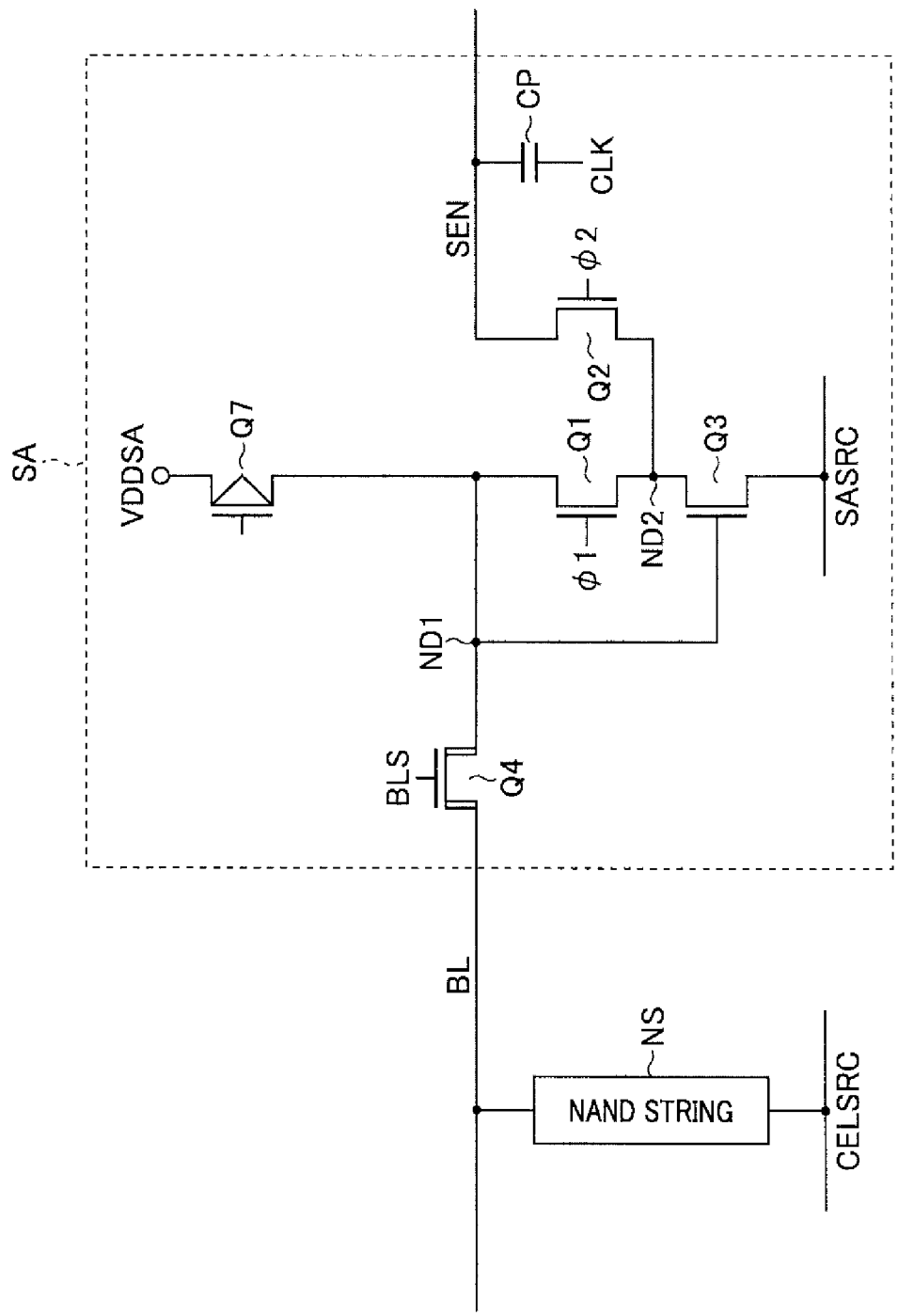
F I G. 8

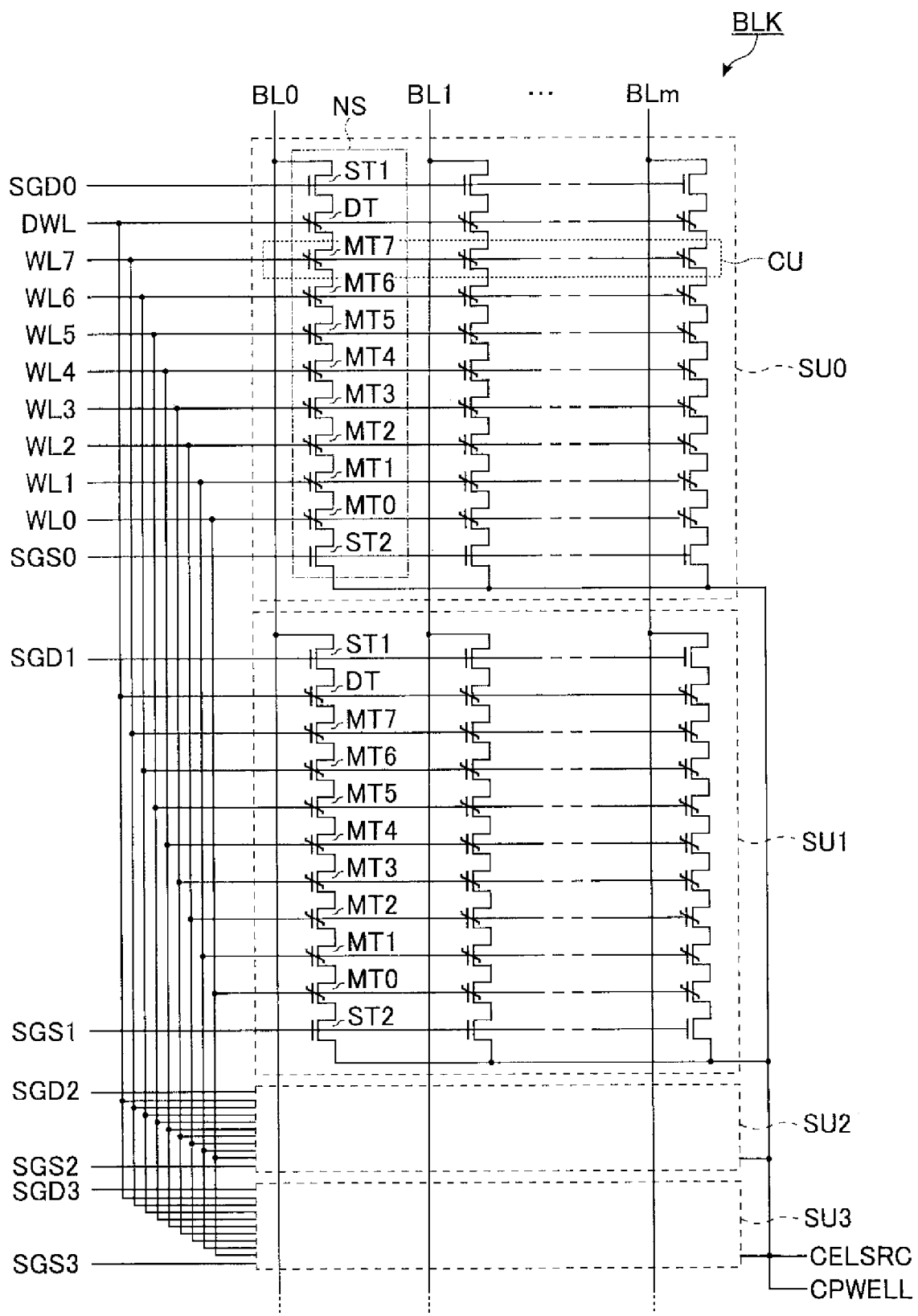
F I G. 17

DEFINITION OF Δnp

DEFINITIONS OF N-PASS AND P-PASS

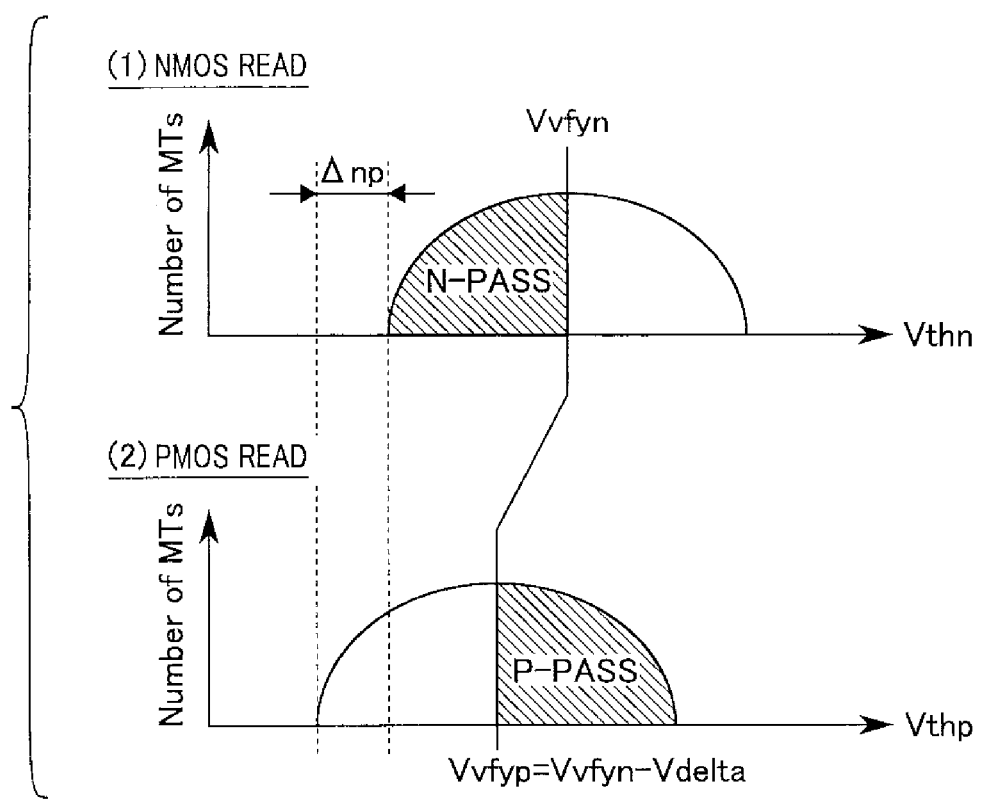
F I G. 23

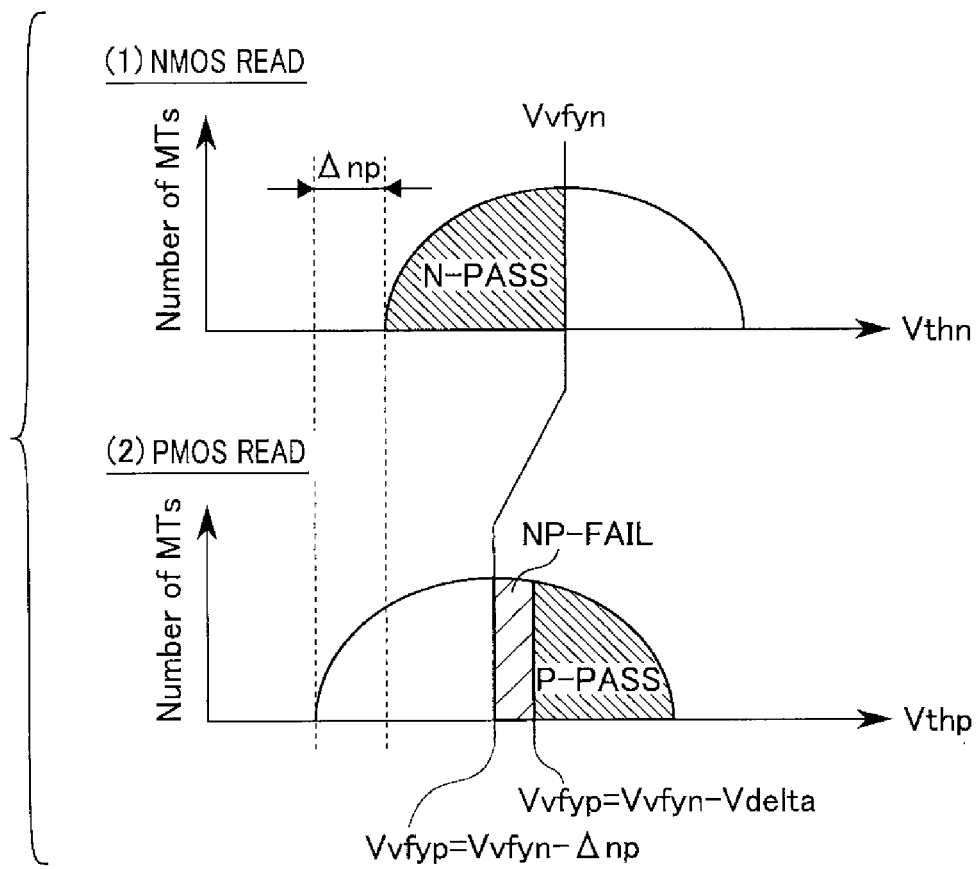
F I G. 24

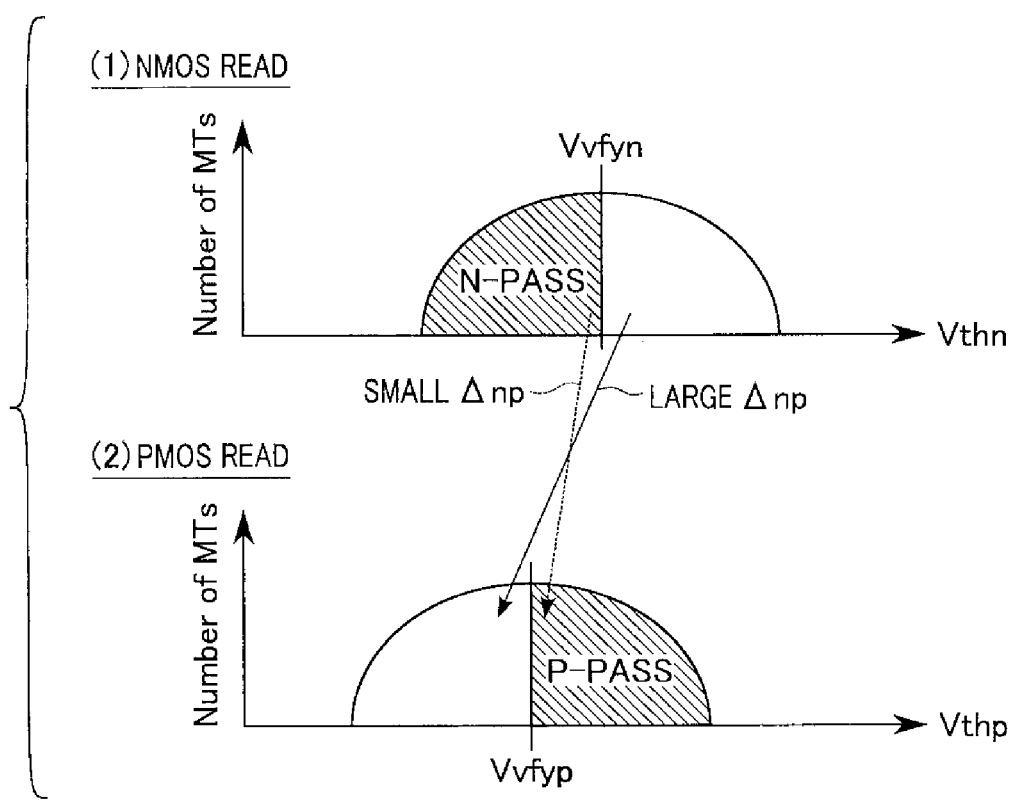
F I G. 30

SEMICONDUCTOR MEMORY DEVICE AND ERASE VERIFY OPERATION

CROSS-REFERENCE TO RELATED APPLICATIONS

This application is a continuation of U.S. application Ser. No. 16/281,293 filed Feb. 21, 2019, which is based upon and claims the benefit of priority from Japanese Patent Application No. 2018-172214, filed Sep. 14, 2018, the entire contents of each of which are incorporated herein by reference.

FIELD

Embodiments relate to a semiconductor memory device.

BACKGROUND

There is known a NAND flash memory which can store data nonvolatilely.

BRIEF DESCRIPTION OF THE DRAWINGS

FIG. 1 is a block diagram illustrating a configuration example of a semiconductor memory device according to a first embodiment.

FIG. 2 is a circuit diagram illustrating a circuit configuration of a memory cell array included in the semiconductor memory device according to the first embodiment includes.

FIG. 4 is a cross-sectional view illustrating an example of a cross-sectional structure of a memory pillar included in the memory cell array included in the semiconductor memory device according to the first embodiment.

FIG. 5 is a threshold distribution diagram illustrating an example of threshold distributions, allocation of data, and read voltages of memory cell transistors in the semiconductor memory device according to the first embodiment.

FIG. 6 is a circuit diagram illustrating an example of a circuit configuration of a row decoder module included in the semiconductor memory device according to the first embodiment.

FIG. 8 is a circuit diagram illustrating an example of a circuit configuration of a sense amplifier section included in the sense amplifier module included in the semiconductor memory device according to the first embodiment.

FIG. 17 is a circuit diagram illustrating an example of a circuit configuration of a memory cell array included in a semiconductor memory device according to a second embodiment.

FIG. 23 is a threshold distribution diagram of memory cell transistors, FIG. 23 illustrating an example of results of NMOS read and PMOS read in a case of Vdelta=$\Delta$np, in the semiconductor memory device according to the third embodiment.

FIG. 24 is a threshold distribution diagram of memory cell transistors, FIG. 24 illustrating an example of results of NMOS read and PMOS read in a case of Vdelta<$\Delta$np, in the semiconductor memory device according to the third embodiment.

FIG. 30 is a threshold distribution diagram of memory cell transistors, FIG. 30 illustrating an example of a variance of Δnp in the semiconductor memory device according to the third embodiment.

DETAILED DESCRIPTION

Figure 3:
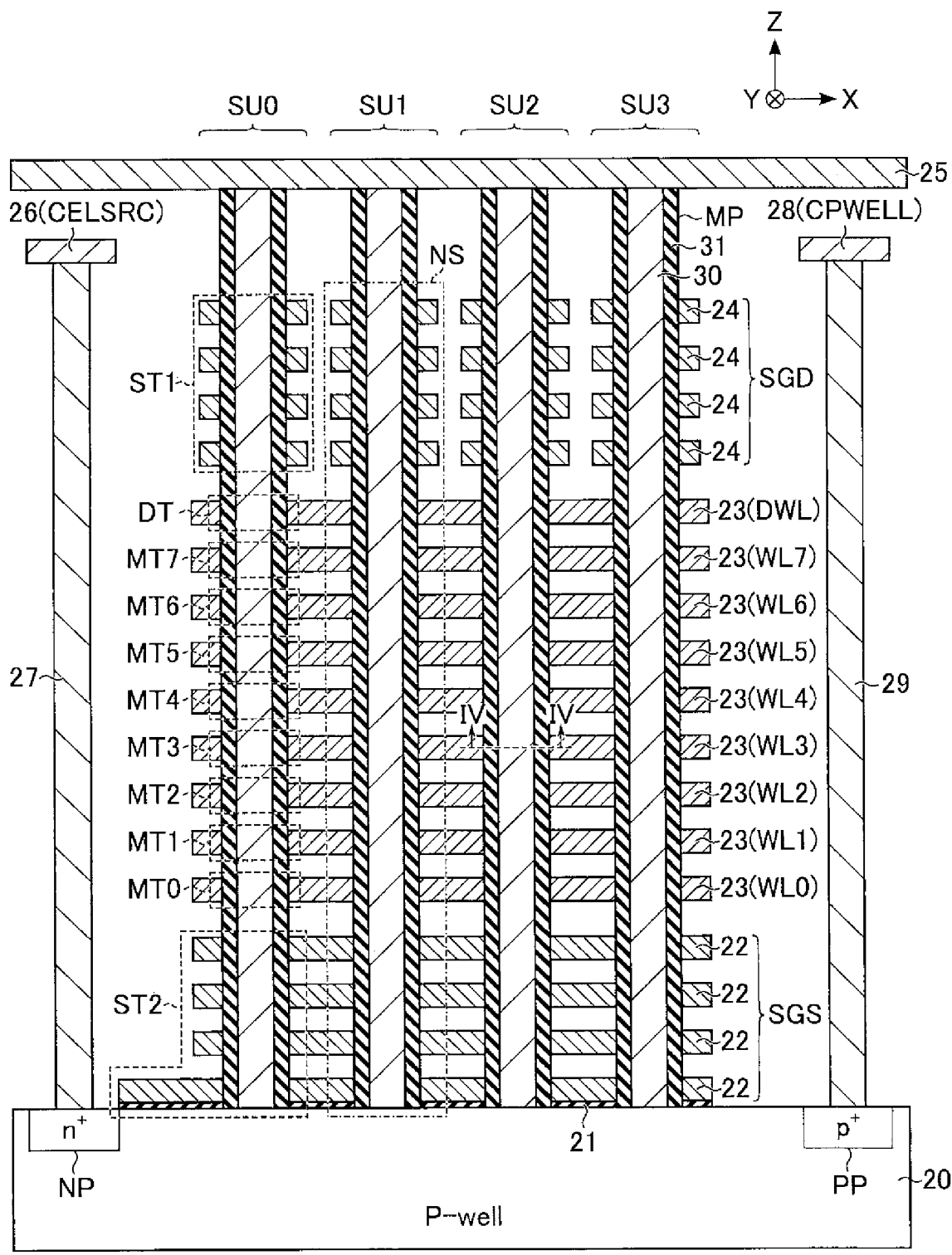
FIG. 3 is a cross-sectional view illustrating an example of a cross-sectional structure of the memory cell array included in the semiconductor memory device according to the first embodiment.

A semiconductor memory device according to an embodiment includes a string, a bit line, a well line, and a sequencer. The string includes a first select transistor, a second select transistor, and a plurality of memory cell transistors connected in series between the first select transistor and the second select transistor. Each of the memory cell transistors use a ferroelectric material for a memory layer. The bit line is connected to the first select transistor. The well line connected to the second select transistor. At a first time instant in an erase verify operation after an erase operation with the string being selected, the sequencer is configured to apply a first voltage to a gate of the memory cell transistor, to apply a second voltage, which is lower than the first voltage, to a gate of the first select transistor, to apply a third voltage, which is lower than the first voltage, to a gate of the second select transistor, to apply a fourth voltage to the bit line, and to apply a fifth voltage, which is higher than the fourth voltage, to the well line.

Hereinafter, embodiments will be described with reference to the accompanying drawings. The embodiments illustrate devices and methods for embodying the technical concept of the invention. The drawings are schematic or conceptual ones. The dimensions, ratios, etc. in the drawings do not necessarily agree with the actual ones. The technical concept of the present invention is not specified by shapes, structures, dispositions, etc. of structural elements.

In the following description, structural elements having substantially the same function and configuration are denoted by the same reference signs. Numeric characters after the letters constituting a reference sign are referred to by reference signs containing the same letters, and are used to distinguish elements having the same structure. When the elements denoted by the reference signs containing the same letters do not need to be distinguished from each other, these elements are referred to by the reference signs containing only the letters.

[1] First Embodiment

A semiconductor memory device according to a first embodiment will be described hereinafter. The semiconductor memory device according to the first embodiment is a NAND flash memory (FeNAND: Ferroelectric NAND flash memory) using a ferroelectric material for a memory layer.

[1-1] Configuration of Semiconductor Memory Device 1

[1-1-1] Entire Configuration of Semiconductor Memory Device 1

FIG. 1 illustrates a configuration example of a semiconductor memory device 1 according to the first embodiment. The semiconductor memory device 1 is controlled by, for example, an external memory controller 2. As illustrated in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer of 1 or more). The block BLK is a set of a plurality of memory cells which can store data nonvolatilely, and the block BLK is used, for example, as an erase unit of data.

In addition, in the memory cell array 10, a plurality of bit lines and a plurality of word lines are provided. Each memory cell is associated with, for example, one bit line and one word line. The detailed configuration of the memory cell array 10 will be described later.

The command register 11 holds a command CMD which the semiconductor memory device 1 received from the memory controller 2. The command CMD includes, for example, commands for causing the sequencer 13 to execute a read operation, a write operation, and an erase operation.

The address register 12 holds address information ADD which the semiconductor memory device 1 received from the memory controller 2. The address information ADD includes, for example, a block address BA, a page address PA, and a column address CA. For example, the block address BA, page address PA and column address CA are used for selecting a block BLK, a word line and a bit line, respectively.

The sequencer 13 controls the operation of the entirety of the semiconductor memory device 1. For example, based on the command CMD that is held in the command register 11, the sequencer 13 controls the driver module 14, row decoder module 15 and sense amplifier module 16, and executes a read operation, a write operation and an erase operation.

The driver module 14 generates voltages which are used in the read operation, write operation and erase operation, and supplies the generated voltages to, for example, the memory cell array 10, row decoder module 15, and sense amplifier module 16. For example, the driver module 14 applies the generated voltage to a signal line corresponding to a word line selected based on the page address PA that is held in the address register 12.

Based on the block address BA that is held in the address register 12, the row decoder module 15 selects one corresponding block BLK in the memory cell array 10. Then, the row decoder module 15 transfers, for example, the voltage, which was applied to the signal line corresponding to the selected word line, to the selected word line in the selected block BLK.

The sense amplifier module 16 applies, in a write operation, a desired voltage to each bit line, in accordance with write data DAT which is received from the memory controller 2. In addition, in a read operation, the sense amplifier module 16 determines data which is stored in a memory cell, based on the voltage of the bit line, and transfers the determination result to the memory controller 2 as read data DAT.

The communication between the semiconductor memory device 1 and memory controller 2 supports, for example, a NAND interface standard. For example, in the communication between the semiconductor memory device 1 and memory controller 2, use is made of a command latch enable signal CLE, an address latch enable signal ALE, a write enable signal WEn, a read enable signal REn, a ready/busy signal RBn, and an input/output signal I/O.

The command latch enable signal CLE is a signal indicating that an input/output signal I/O, which the semiconductor memory device 1 received, is a command CMD. The address latch enable signal ALE is a signal indicating that an input/output signal I/O, which the semiconductor memory device 1 received, is address information ADD. The write enable signal WEn is a signal which instructs the semiconductor memory device 1 to input the input/output signal I/O. The read enable signal REn is a signal which instructs the semiconductor memory device 1 to output the input/output signal I/O.

The ready/busy signal RBn is a signal which notifies the memory controller 2 whether the semiconductor memory device 1 is in a ready state in which the semiconductor memory device 1 accepts an instruction from the memory controller 2, or in a busy state in which the semiconductor memory device 1 does not accept an instruction from the memory controller 2. The input/output signal I/O is, for example, a signal of an 8-bit width, and may include the command CMD, address information ADD, data DAT, etc.

The above-described semiconductor memory device 1 and memory controller 2 may constitute a single semiconductor device by being combined. Examples of such a semiconductor device include a memory card such as an SD™ card, and an SSD (solid state drive).

[1-1-2] Circuit Configuration of the Memory Cell Array 10

FIG. 2 illustrates an example of a circuit configuration of the memory cell array 10 included in the semiconductor memory device 1 according to the first embodiment. FIG. 2 illustrates, in an extracted manner, one of the blocks BLK included in the memory cell array 10. As illustrated in FIG. 2, the block BLK includes, for example, four string units SU0 to SU3.

Each string unit SU includes a plurality of NAND strings NS. The NAND strings NS are associated with bit lines BL0 to BLm (m is an integer of 1 or more), respectively. Each NAND string NS includes, for example, memory cell transistors MT0 to MT7, a dummy transistor DT, and select transistors ST1 and ST2.

Each of the memory cell transistors MT and dummy transistor DT includes a block insulation film in which a ferroelectric material is used between the gate and channel. The memory cell transistor MT stores data nonvolatilely, and the dummy transistor DT is not used for storing data. Each of the select transistors ST1 and ST2 is used for selecting the string unit SU in various operations.

In each NAND string NS, the drain of the select transistor ST1 is connected to the associated bit line BL. The source of the select transistor ST1 is connected to the drain of the dummy transistor DT. The source of the dummy transistor DT is connected to one end of the series-connected memory transistors MT0 to MT7. The other end of the series-connected memory transistors MT0 to MT7 is connected to the drain of the select transistor ST2.

In the same block BLK, the source of the select transistor ST2 is commonly connected to a source line CELSRC and a well line CPWELL. The gates of the select transistors ST1 in the string units SU0 to SU3 are commonly connected to select gate lines SGD0 to SGD3, respectively. The gates of the memory cell transistors MT0 to MT7 are commonly connected to word lines WL0 to WL7. The gates of the dummy transistors DT are commonly connected to a dummy word line DWL. The gates of the select transistors ST2 are commonly connected to a select gate line SGS.

In the above-described circuit configuration of the memory cell array 10, a plurality of NAND strings NS, to which the same column address CA is allocated, are commonly connected to the same bit line BL between a plurality of blocks BLK. The source line CELSRC is commonly connected, for example, between blocks BLK. The well line CPWELL is commonly connected, for example, between blocks BLK.

A set of memory cell transistors MT, which are connected to a common word line WL in one string unit SU, is referred to as, for example, "cell unit CU". For example, the storage capacity of the cell unit CU including memory cell transistors MT each storing 1-bit data is defined as "one-page data". The cell unit CU may have a storage capacity of two or more page data, in accordance with the number of bits of data which the memory cell transistor MT stores.

The circuit configuration of the memory cell array 10 included in the semiconductor memory device 1 according to the first embodiment is not limited to the above-described configuration. For example, the number of memory cell transistors MT, the number of dummy transistors DT and the number of select transistors ST1 and ST2 in each NAND string NS may be designed to be numbers that are freely selected. The number of string units SU, which each block BLK includes, may be designed to be a freely selected number. The dummy transistor DT may be provided between the select transistor ST2 and the memory cell transistor MT0, or may be inserted between series-connected memory cell transistors MT.

[1-1-3] Structure of the Memory Cell Array 10

Next, the structure of the memory cell array 10 included in the semiconductor memory device 1 according to the first embodiment will be described. In cross-sectional views to be referred to hereinafter, depiction of structural elements, such as insulation layers (interlayer insulation films), interconnects and contacts, is omitted as needed, for the purpose of easier understanding of the drawings. In addition, in the cross-sectional views to be referred to hereinafter, an X direction corresponds to the direction of extension of bit lines BL. A Y direction corresponding to the direction of extension of word lines WL. A Z direction corresponds to a direction vertical to the surface of the semiconductor substrate on which the semiconductor memory device 1 is formed.

FIG. 3 illustrates an example of a cross-sectional structure of the memory cell array 10 included in semiconductor memory device 1 according to the first embodiment, and illustrates, in an extracted manner, a structure corresponding to one block BLK. As illustrated in FIG. 3, for example, a region where the memory cell array 10 is formed includes a P-well region 20, an insulator layer 21, four conductor layers 22, nine conductor layers 23, four conductor layers 24, a plurality of memory pillars MP, conductor layers 25, 26 and 28, and contacts 27 and 29.

The P-well region 20 is provided near a surface of the semiconductor substrate. The P-well region 20 includes an $n^+$ impurity diffusion region and a $p^+$ impurity diffusion region which are spaced apart. Each of the $n^+$ impurity diffusion region and $p^+$ impurity diffusion region is provided near the surface of the P-well region 20.

The insulator layer 21 is provided on the P-well region 20. The four conductor layers 22, which are mutually spaced apart and stacked, are provided on the insulator layer 21. The nine conductor layers 23, which are mutually spaced apart and stacked, are provided above the uppermost conductor layer 22. The four conductor layers 24, which are mutually spaced apart and stacked, are provided above the conductor layers 23. The conductor layer 25 is provided above the uppermost conductor layer 24.

Each conductor layer 22 is configured to extend in an XY plane and is used as the select gate line SGS. Each conductor layer 23 is configured to extend in the XY plane, and the nine conductor layers 23 are used as the word lines WL0 to WL7 and dummy word line DWL in the named order from the lowermost layer. Each conductor layer 24 is configured to extend in the Y direction and is used as the select gate line SGD. The conductor layer 25 is configured to extend in the X direction, and is used as the bit line BL. In a region not illustrated, a plurality of conductor layers 25 are arranged in the Y direction.

Each of the memory pillars MP penetrates (passes through) the insulator layer 21, four conductor layers 22, nine conductor layers 23 and four conductor layers 24. One memory pillar MP corresponds to one NAND string NS. The conductor layers 24, which the memory pillars MP corresponding to the string units SU0 to SU3 penetrate, are mutually isolated in each interconnect layer. In the present example, the string unit SU is formed of a set of NAND strings NS which are arranged in the Y direction.

In addition, each of the memory pillars MP includes, for example, a semiconductor film 30 and a ferroelectric film 31. The semiconductor film 30 is formed, for example, in a columnar shape extending in the Z direction. The side surface of the semiconductor film 30 is covered with the ferroelectric film 31.

FIG. 4 is a cross-sectional view taken along line IV-IV in FIG. 3. FIG. 4 illustrates an example of a cross-sectional structure of the memory pillar MP in the layer including the conductor layer 23. As illustrated in FIG. 4, in the layer including the conductor layer 23, for example, the semiconductor film 30 is provided in the central portion of the memory pillar MP. The ferroelectric film 31 surrounds the side surface of the semiconductor film 30. The conductor layer 23 surrounds the side surface of the ferroelectric film 31. Note that an insulator film may be buried in an inside of the semiconductor film 30.

Referring back to FIG. 3, a lower part of the semiconductor film 30 is put in contact with the P-well region 20. An upper part of the semiconductor film 30 is put in contact with the conductor layer 25. The semiconductor films 30 in the memory pillars MP corresponding to the same column address are electrically connected to the same conductor layer 25. Note that the upper part of the semiconductor film 30 and the conductor layer 25 may electrically be connected via a contact, an interconnect, or the like.

The semiconductor film 30 is, for example, non-doped polycrystalline silicon, and function as a current path of the NAND string NS. The ferroelectric film 31 functions as a block insulation film, and can change the direction of electric polarization in accordance with the magnitude of a voltage that is applied to the conductor layer 23.

The conductor layer 26 is disposed, for example, in a interconnect layer between the uppermost conductor layer 24 and the conductor layer 25, and is used as the source line CELSRC. The source line CELSRC is an interconnect for applying a voltage to the memory pillar MP via the P-well region 20. The conductor layer 26 is electrically connected to the n$^+$ impurity diffusion region NP via the contact 27.

The conductor layer 28 is disposed, for example, in a interconnect layer between the uppermost conductor layer 24 and the conductor layer 25, and is used as the well line CPWELL. The well line CPWELL is an interconnect for applying a voltage to the memory pillar MP via the P-well region 20. The conductor layer 28 is electrically connected to the p$^+$ impurity diffusion region PP via the contact 29.

In the above-described structure of the memory cell array 10, for example, a part, in which the memory pillar MP and conductor layer 22 intersect, functions as the select transistor ST2. A part, in which the memory pillar MP and conductor layer 23 intersect, functions as the memory cell transistor MT or dummy transistor DT. A part, in which the memory pillar MP and conductor layer 24 intersect, functions as the select transistor ST1.

The lowermost conductor layer 22 and insulator layer 21 are formed up to the vicinity of the n$^+$ impurity diffusion region NP. Thereby, when the select transistor ST2 is set in the ON state, the memory cell transistor MT0 and the n$^+$ impurity diffusion region NP are electrically connected by a channel which is formed near the surface of the P-well region 20.

The above-described structure of the memory cell array 10 is merely an example, and may be modified as needed. For example, the number of conductor layers 23 is designed based on the number of word lines WL and dummy word lines DWL. The number of conductor lines 22, which are used as select gate lines SGS, may be designed to be a freely selected number. The number of conductor lines 24, which are used as select gate lines SGD, may be designed to be a freely selected number.

[1-1-4] Re: Memory Cell Transistor MT

In the memory cell transistor MT using a ferroelectric material, polarization is used for storing data. Specifically, for example, when a voltage is applied to the word line WL, an electric field occurs in the ferroelectric film 31. Then, in the inside of the ferroelectric film 31 which is affected by the electric field, the positions of ions disposed in the crystal lattice change, and polarization occurs.

A polarization quantity, which is indicative of a degree of polarization, is defined by, for example, a surface charge quantity per unit area, which occurs on the ferroelectric film 31 at a contact surface between the ferroelectric film 31 and semiconductor film 30. In accordance with the polarization quantity, a quantity of electrons, which can cancel the surface charge quantity, occurs on the semiconductor film 30 which is in contact with the ferroelectric film 31.

The threshold voltage of the memory cell transistor MT can be changed in accordance with the magnitude of the voltage which is applied to the word line WL, and the hysteresis of the application of the voltage. For example, when the voltage applied to the word line WL is less than a predetermined voltage Vc, the ferroelectric film 31 restores, after the stop of application of the voltage, to the state prior to the application of the voltage.

On the other hand, when the voltage applied to the word line WL is equal to or greater than the predetermined voltage Vc, the ferroelectric film 31 keeps the state of a fixed quantity of polarization, even after the stop of application of the voltage. As a result, the word line WL and semiconductor film 30 are set in a state similar to a case in which a voltage with a magnitude corresponding to the polarization quantity is applied between the word line WL and the semiconductor film 30, and the threshold voltage of the memory cell transistor MT lowers.

In the semiconductor memory device 1 according to the first embodiment, the threshold voltage of the memory cell transistor MT is changed in accordance with the polarization quantity as described above, and thereby data of a plurality of bits is stored in the memory cell transistor MT.

FIG. 5 illustrates an example of threshold distributions, read voltages and verify voltages of memory cell transistors MT in the semiconductor memory device 1 according to the first embodiment. The ordinate axis of the threshold distributions illustrated in FIG. 5 corresponds to the number of memory cell transistors MT, and the abscissa axis corresponds to threshold voltages Vth of memory cell transistors MT. As illustrated in FIG. 5, in the semiconductor memory device 1 according to the first embodiment, the threshold voltage of the memory cell transistor MT can take any one of an "ER" state, an "A" state, a "B" state and a "C" state.

The "ER" state corresponds to an erase state of the memory cell transistor MT. Each of the "A" state, "B" state and "C" state corresponds to a state in which data is written to the memory cell transistor MT. The polarization quantity of the ferroelectric film 31 increases in the order of the "ER" state, "A" state, "B" state and "C" state, and the threshold voltage of the memory cell transistor MT decreases in the order of the "ER" state, "A" state, "B" state and "C" state.

Read voltages used in read operations are set between neighboring threshold distributions. Concretely, a read voltage AR is set between the "ER" state and "A" state. The memory cell transistor MT, to the gate of which the read voltage AR was applied, is turned on when the threshold voltage is distributed in the "C" state, "B" state or "A" state, and is turned off when the threshold voltage is distributed in the "ER" state.

A read voltage BR is set between the "A" state and "B" state. The memory cell transistor MT, to the gate of which the read voltage BR was applied, is turned on when the threshold voltage is included in the "C" state or "B" state, and is turned off when the threshold voltage is included in the "A" state or "ER" state. A read voltage CR is set between the "B" state and "C" state. The memory cell transistor MT, to the gate of which the read voltage CR was applied, is turned on when the threshold voltage is included in the "C" state, and is turned off when the threshold voltage is included in the "B" state, "A" state or "ER" state.

In addition, a read pass voltage Vread is set at a voltage higher than a maximum threshold voltage in the "ER" state. The memory cell transistor MT, to the gate of which the read pass voltage Vread was applied, is turned on, regardless of the stored data.

Further, verify voltages used in write operations are set between neighboring threshold distributions. Concretely, verify voltages AV, BV and CV are set in association with the "A" state, "B" state and "C" state, respectively.

The verify voltage AV is set between the "ER" state and "A" state and near the "A" state. The verify voltage BV is set between the "A" state and "B" state and near the "B" state. The verify voltage CV is set between the "B" state and "C" state and near the "C" state. Specifically, for example, the verify voltages AV, BV and CV are set to be lower than the read voltages AR, BR and CR, respectively.

In the write operation, when the semiconductor memory device 1 detects that the threshold voltage of the memory cell transistor MT, to which certain data is to be stored, has decreased below the verify voltage corresponding to this data, the semiconductor memory device 1 completes the program of the memory cell transistor MT.

Different 2-bit data are allocated to the above-described four kinds of threshold distributions of memory cell transistors MT. An example of the allocation of data to the threshold distributions is as follows.

"ER" level: "11 (upper bit/lower bit)" data,
"A" level: "01" data,
"B" level: "00" data, and
"C" level: "10" data.

When this allocation of data is applied, one page data (lower page data) constituted by the lower bits is finally determined by the read operation using the read voltage BR. One page data (upper page data) constituted by the upper bits is finally determined by the read operation using the read voltages CR and AR.

Specifically, each of the lower page data and upper page data is finally determined by the read operation using one or two kinds of read voltages. This allocation of data is called, for example, "1-2 code". In the present specification, the case in which the "1-2 code" is applied to the allocation of data of memory cell transistors MT is described by way of example.

[1-1-5] Circuit Configuration of the Row Decoder Module 15

FIG. 6 illustrates an example of the circuit configuration of the row decoder module 15 included in the semiconductor memory device 1 according to the first embodiment, and FIG. 6 also illustrates interconnects between the row decoder module 15, and the driver module 14 and memory cell array 10. As illustrated in FIG. 6, the driver module 14 is connected to the row decoder module 15 by a plurality of signal lines. In addition, the driver module 14 can apply voltages to the source line CELSRC and well line CPWELL which are provided in the memory cell array 10.

The row decoder module 15 includes, for example, row decoders RD0 to RDn. The row decoders RD0 to RDn are associated with the blocks BLK0 to BLKn, respectively.

Hereinafter, paying attention to the row decoder RD0 corresponding to the block BLK0, a detailed circuit configuration of the row decoder RD will be described. Since the circuit configurations of the other row decoders RD are the same as the circuit configuration of the row decoder RD0, a description thereof is omitted.

The row decoder RD includes, for example, a block decoder BD and transistors TR0 to TR18.

The block decoder BD decodes a block address, and, applies, based on the decoded result, predetermined voltages to transfer gate lines TG and bTG. The transfer gate lines TG is commonly connected to the transistors TR0 to TR13. An inversion signal of the transfer gate line TG is input to the transfer gate line bTG, and the transfer gate line bTG is commonly connected to the transistors TR14 to TR18.

The transistors TR0 to TR18 are n-channel MOS transistors of high breakdown voltage. The transistor TR is connected between a signal line from the driver module 14 and an interconnect provided in the block BLK0.

Concretely, the drain of the transistor TR0 is connected to a signal line SGSD. The source of the transistor TR0 is connected to the select gate line SGS of the block BLK0. The drains of the transistors TR1 to TR8 are connected to signal lines CG0 to CG7, respectively. The sources of the transistors TR1 to TR8 are respectively connected to one-side ends of the word lines WL0 to WL7 corresponding to the block BLK0. The drain of the transistor TR9 is connected to a signal line CGD. The source of the transistor TR9 is connected to one end of the dummy word line DWL corresponding to the block BLK0.

The drains of the transistors TRIO to TR13 are connected to signal lines SGDD0 to SGDD3, respectively. The sources of the transistors TRIO to TR13 are connected to the select gate lines SGD0 to SGD3, respectively. The drain of the transistor TR14 is connected to a signal line USGS. The source of the transistor TR14 is connected to the select gate line SGS. The drains of the transistors TR15 to TR18 are commonly connected to a signal line USGD. The sources of the transistors TR15 to TR18 are connected to the select gate lines SGD0 to SGD3, respectively.

By the above-described configuration, the row decoder module 15 can select the block BLK for which various operations are executed. Concretely, at times of various operations, the block decoder BD corresponding to the selected block BLK applies voltages of "H" level and "L"

level to the transfer gate lines TG and bTG, respectively. The block decoder BD corresponding to an unselected block BLK applies voltages of "L" level and "H" level to the transfer gate lines TG and bTG, respectively.

In the present specification, the "H" level corresponds to a voltage at which an NMOS transistor is set in the ON state and a PMOS transistor is set in the OFF state. The "L" level corresponds to a voltage at which an NMOS transistor is set in the OFF state and a PMOS transistor is set in the ON state.

For example, when the block BLK0 was selected, in the row decoder RD0, the transistors TR0 to TR13 are set in the ON state and the transistors TR14 to TR18 are set in the OFF state. On the other hand, in the other row decoders RD, the transistors TR0 to TR13 are set in the OFF state and the transistors TR14 to TR18 are set in the ON state.

In this case, current paths are formed between the various interconnects provided in the block BLK0 and the corresponding signal lines, and current paths are cut off between the interconnects provided in the other blocks BLK (unselected blocks BLK) and the corresponding signal lines. In addition, voltages are applied via the signal lines USGD and USGS to the select gate lines SGD and SGS corresponding to the unselected block BLK.

As a result, the voltages, which are applied to the signal lines by the driver module 14, are applied via the row decoder RD0 to the interconnects provided in the selected block BLK0. The row decoder module 15 can similarly operate when the other blocks BLK are selected.

The above-described circuit configuration of the row decoder module 15 is merely an example, and the circuit configuration is not limited to this. For example, the number of transistors TR, which the row decoder module 15 includes, may be set to a number based on the number of interconnects provided in each block BLK.

[1-1-6] Circuit Configuration of the Sense Amplifier Module 16

Figure 7:
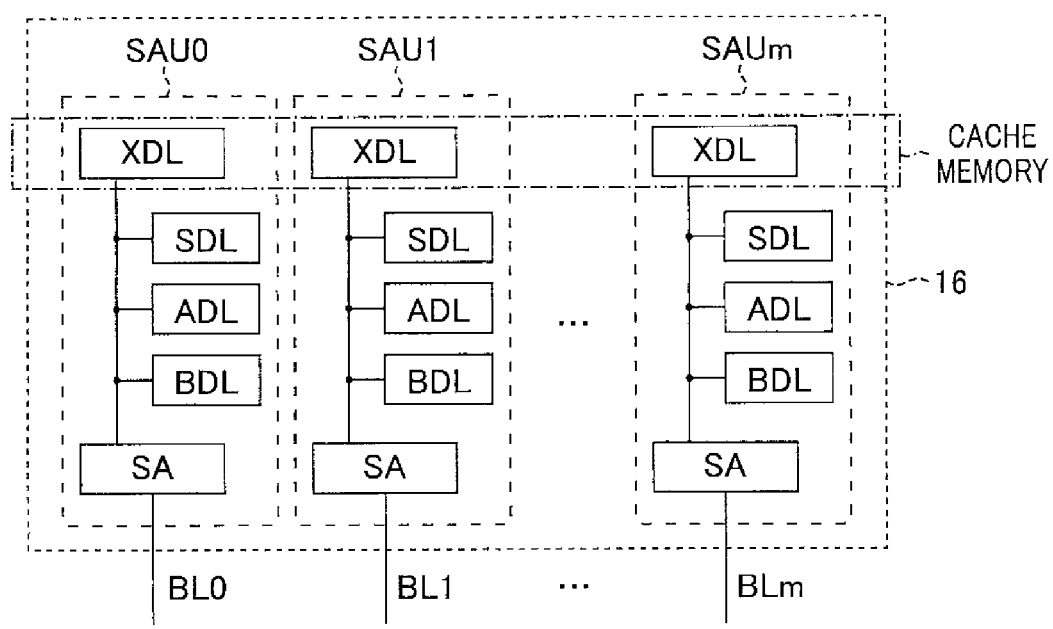
FIG. 7 is a circuit diagram illustrating an example of a circuit configuration of a sense amplifier module included in the semiconductor memory device according to the first embodiment.

FIG. 7 illustrates an example of the circuit configuration of the sense amplifier module 16 included in the semiconductor memory device 1 according to the first embodiment. As illustrated in FIG. 7, the sense amplifier module 16 includes, for example, sense amplifier units SAU0 to SAUm. The sense amplifier units SAU0 to SAUm are associated with the bit lines BL0 to BLm, respectively.

Each sense amplifier unit SAU includes, for example, a sense amplifier section SA and latch circuits SDL, ADL, BDL and XDL. The sense amplifier section SA and the latch circuits SDL, ADL, BDL and XDL are connected so as to be capable of mutually transmitting and receiving data.

The sense amplifier section SA determines, for example, in a read operation, whether read data is "0" or "1", based on the voltage of the corresponding bit line BL. In other words, the sense amplifier section SA senses the data which is read to the corresponding bit line BL, and determines the data which the selected memory cell stores.

Each of the latch circuits SDL, ADL, BDL and XDL temporarily holds read data or write data. The latch circuit XDL is connected to an input/output circuit (not illustrated), and can be used for input/output of data between the sense amplifier unit SAU and the input/output circuit.

The latch circuit XDL can also function as a cache memory of the semiconductor memory device 1. For example, the semiconductor memory device 1 can be set in a ready state if the latch circuit XDL is free, even when the latch circuits SDL, ADL and BDL are being used.

(Circuit Configuration Example of the Sense Amplifier Section SA)

FIG. 8 illustrates an example of the circuit configuration of the sense amplifier section SA included in the sense amplifier module 16 included in the semiconductor memory device 1 according to the first embodiment. As illustrated in FIG. 8, the sense amplifier section SA includes, for example, transistors Q1, Q2, Q3, Q4 and Q7, and a capacitor CP. Each of the transistors Q1, Q2 and Q3 is an NMOS transistor. The transistor Q4 is an NMOS transistor of high breakdown voltage. The transistor Q7 is a PMOS transistor.

The transistor Q1 is connected between a node ND1 and a node ND2. A control signal $\Phi 1$ is input to the gate of the transistor Q1. The transistor Q2 is connected between a node SEN and the node ND2. A control signal $\Phi 2$ is input to the gate of the transistor Q2.

The transistor Q3 is connected between the node ND2 and a node SASRC. The gate of the transistor Q3 is connected to the node ND1. The transistor Q4 is connected between the node ND1 and the bit line BL. A control signal BLS is input to the gate of the transistor Q4.

The transistor Q7 is connected between a power supply node, to which a power supply voltage VDDSA is applied, and the node ND1. One end of the capacitor CP is connected to the node SEN. A clock CLK is input to the other end of the capacitor CP. The NAND string NS is connected between the bit line BL and source line CELSRC.

As described above, in the sense amplifier section SA, the transistors Q1 and Q2 are cascode-connected between the bit line BL and node SEN. The transistor Q4 is provided, for example, in order to electrically disconnect the bit line BL and node ND1 when the memory cell transistor MT is erased.

In addition, in the sense amplifier section SA, the node SEN is a sense node which charges and discharges the capacitor CP in accordance with the logic of data which is read from the memory cell transistor MT. The control signals, which are input to the gates of the transistors Q1, Q2, Q3, Q4 and Q7, are controlled by, for example, the sequencer 13.

Circuit Configuration Example of the Sense Amplifier Unit SAU

Figure 9:
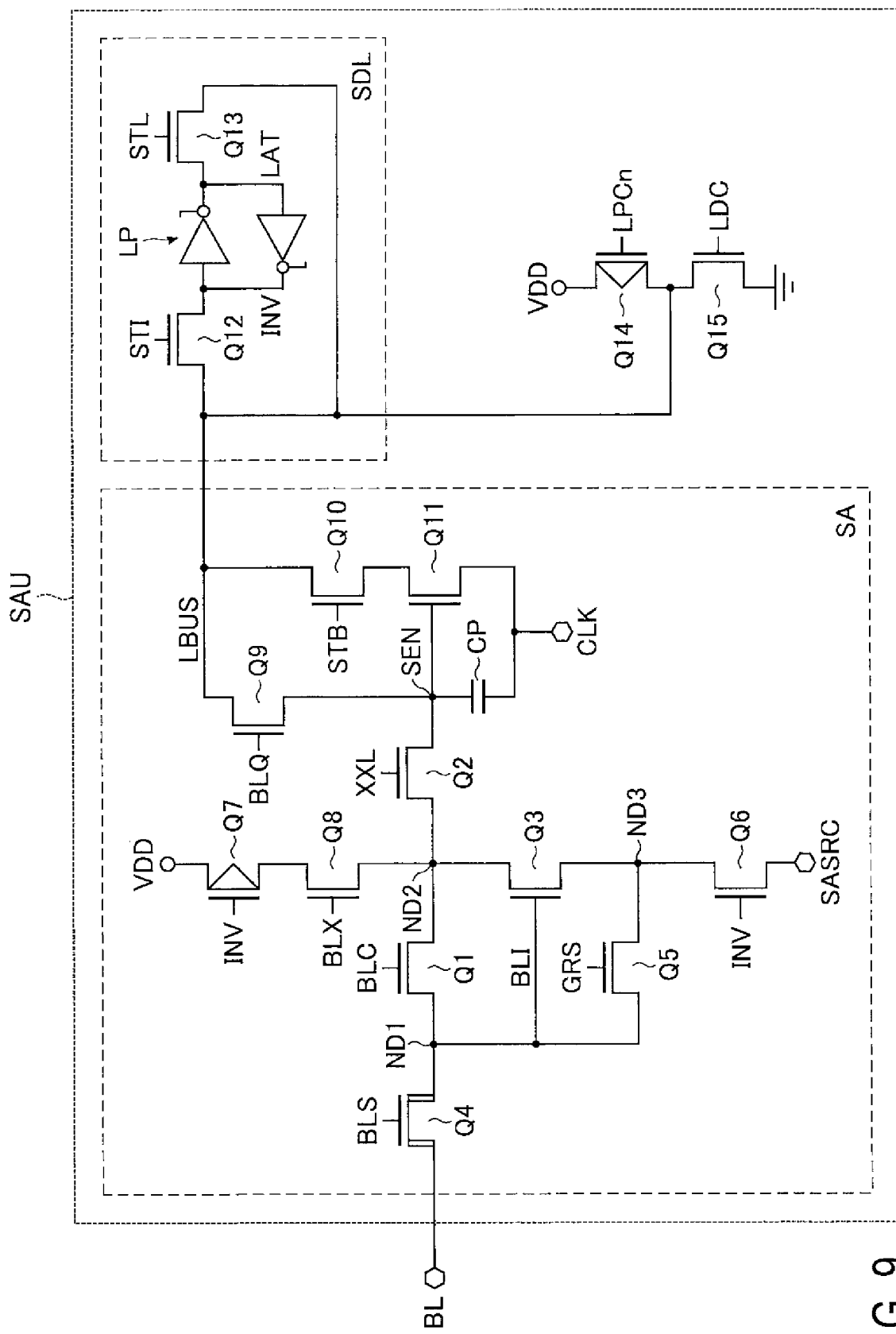
FIG. 9 is a circuit diagram illustrating an example of a circuit configuration of a sense amplifier unit included in the sense amplifier module included in the semiconductor memory device according to the first embodiment.

FIG. 9 illustrates an example of the circuit configuration of the sense amplifier unit SAU included in the sense amplifier module 16 included in the semiconductor memory device 1 according to the first embodiment. In the circuit configuration illustrated in FIG. 9, the transistors having the same functions as the transistors described with reference to FIG. 8 are denoted by the same reference signs. As illustrated in FIG. 9, the sense amplifier unit SAU includes, for example, transistors Q1 to Q15, a capacitor CP and a latch section LP. Each of the transistors Q5, Q6, Q8 to Q13, and Q15 is an NMOS transistor. The transistor Q14 is a PMOS transistor.

The transistor Q1 is connected between a node ND1 and a node ND2. A control signal BLC is input to the gate of the transistor Q1. The transistor Q2 is connected between a node SEN and the node ND2. A control signal XXL is input to the gate of the transistor Q2. The transistor Q3 is connected between the node ND2 and a node ND3. The gate of the transistor Q3 is connected to the node ND1. The transistor Q4 is connected between the node ND1 and the bit line BL. A control signal BLS is input to the gate of the transistor Q4.

The transistor Q5 is connected between the node ND1 and node ND3. A control signal GRS is input to the gate of the transistor Q5. The transistor Q6 is connected between the node ND3 and a node SASRC. The gate of the transistor Q6 is connected to a node INV. The transistors Q7 and Q8 are connected in series between a power supply node, to which a power supply voltage VDD is applied, and the node ND2. The gate of the transistor Q7 is connected to the node INV. A control signal BLX is input to the gate of the transistor Q8.

The transistor Q9 is connected between a bus LBUS and the node SEN. A control signal BLQ is input to the gate of the transistor Q9. One end of the capacitor CP is connected to the node SEN. A clock CLK is input to the other end of the capacitor CP. The transistors Q10 and Q11 are connected in series between the bus LBUS and the other end of the capacitor CP. A control signal STB is input to the gate of the transistor Q10. The gate of the transistor Q11 is connected to the node SEN.

The transistor Q12 is connected between the bus LBUS and an input node (node INV) of the latch section LP. A control signal STI is input to the gate of the transistor Q12. The transistor Q13 is connected between the bus LBUS and an output node (node LAT) of the latch section LP. A control signal STL is input to the gate of the transistor Q13. The transistor Q14 is connected between a power supply node, to which the power supply voltage VDD is applied, and the bus LBUS. A control signal LPCn is input to the gate of the transistor Q14. The transistor Q15 is connected between the bus LBUS and a ground node. A control signal LDC is input to the gate of the transistor Q15.

In the above-described circuit configuration of the sense amplifier unit SAU, the set of the transistors Q1 to Q11 and clock CLK corresponds to the sense amplifier section SA. The set of the transistors Q12 and Q13 and latch section LP corresponds to the latch circuit SDL.

In the circuit configuration of the sense amplifier unit SAU illustrated in FIG. 9, depiction of the latch circuits ADL, BDL and XDL is omitted. Each of the latch circuits ADL, BDL and XDL has the same circuit configuration as, for example, the latch circuit SDL, and is connected to the bus LBUS. In addition, the latch circuits ADL, BDL and XDL are controlled by control signals which are different from the control signals of the latch circuit SDL, and the nodes of the latch section LP are independent among the latch circuits.

In addition, in the above-described circuit configuration of the sense amplifier unit SAU, the transistor Q5 is provided in order to cause a current, which flows from the bit line BL when data is written to the memory cell transistor MT, to flow to the node ND3 without the intervention of the transistors Q1 and Q2.

The transistors Q7 and Q8 are cascode-connected between the power supply node, to which the power supply voltage VDD is applied, and the node ND2. The transistors Q10 and Q11 are cascode-connected between the bus LBUS and the other end of the capacitor CP.

The transistors Q14 and Q15 are cascode-connected between the power supply node, to which the power supply voltage VDD is applied, and the ground node. The transistors Q14 and Q15 can operation as a lockout controller which forcibly inverts the logic of latch data of the latch section LP, at a time of lockout in the read operation.

The control signals BLC and XXL illustrated in FIG. 9 correspond to the controls signals Φ1 and Φ2 illustrated in FIG. 8. The control signals, which are input to the gates of the transistors Q1, Q2, Q4, Q5, Q8 to Q10, and Q12 to Q15 are controlled by, for example, the sequencer 13.

The above-described circuit configuration of the sense amplifier module 16 is merely an example, and the circuit configuration is not limited to this. For example, the circuit configuration of the sense amplifier unit SAU is properly modified based on the sense method of data which the memory cell transistor MT stores.

[1-2] Operation

The semiconductor memory device 1 according to the first embodiment reads data stored in the memory cell transistor MT, by causing the current, which flows via the memory cell transistor MT, to flow from the source line CELSRC toward the sense amplifier unit SAU.

Hereinafter, descriptions will successively be given of an example of the read operation based on the circuit configurations of the sense amplifier module 16 described with reference to FIG. 8 and FIG. 9, and an example of an erase verify operation using this read operation.

[1-2-1] Read Operation

Operation Example of the Sense Amplifier Section SA

To begin with, a description is given of an example of the operation of the sense amplifier section SA which was described with reference to FIG. 8, in the read operation of the semiconductor memory device 1 according to the first embodiment.

Figure 10:
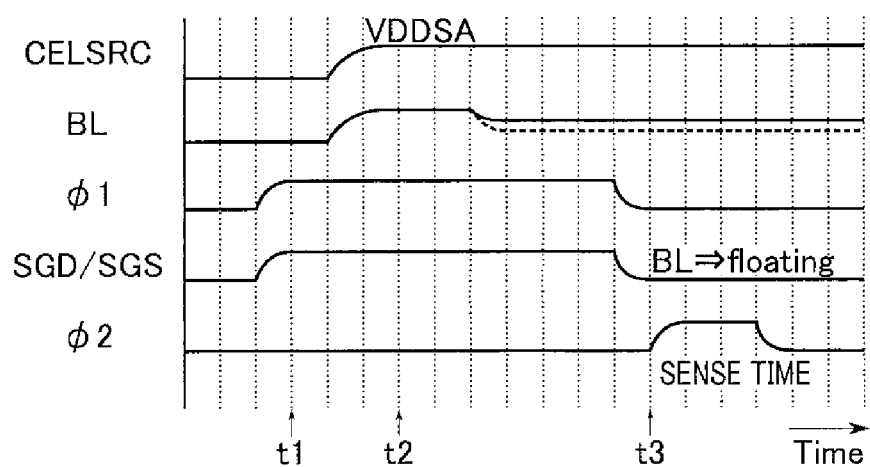
FIG. 10 is a timing chart illustrating an example of an operation of the sense amplifier section in a read operation of the semiconductor memory device according to the first embodiment.

As illustrated in FIG. 10, at time instant t1, the sequencer 13 sets the control signal Φ1 at "H" level, and sets the control signal Φ2 at "L" level. For example, the voltage of the control signal Φ1 is set at "voltage of node SASRC+ threshold voltage of transistor Q1+overdrive voltage Vov" (e.g. about 0.2 V). Thereby, a voltage variation of the node ND2 is suppressed, and the drain bias dependency of the transistor Q1 is suppressed. In addition, at time instant t1, a voltage of "H" level is applied to the select gate lines SGS and SGD.

Then, at time instant t2, the sequencer 13 raises the voltage of the source line CELSRC on one end side of the NAND string NS up to VDDSA. At this time, if the data stored in the memory cell transistor MT is "1", the memory cell transistor MT is in the ON state, and thus a decrease of voltage of the bit line BL is suppressed (a solid-line portion in FIG. 10). On the other hand, if the data stored in the memory cell transistor MT is "0", the memory cell transistor MT is in the OFF state, and thus the voltage of the bit line BL greatly lowers (a broken-line portion in FIG. 10).

At time instant t2, too, the voltage of the control signal Φ1, i.e. the gate voltage of the transistor Q1, is set at "voltage of node SASRC+threshold voltage of transistor Q1+overdrive voltage Vov". Thus, while the transistor Q1 is in the ON state, the voltage of the node ND2 is clamped at "voltage of node SASRC+overdrive voltage Vov". In other words, the voltage of the node ND2 is equal to or slightly lower than the drain voltage of the transistor Q1 (voltage of the node ND1).

In addition, at time instant t2, the voltage of the node ND1 changes to a voltage corresponding to the cell current flowing in the bit line BL. Since the voltage of the node ND2 is higher than the voltage of the node SASRC, and the voltage of the node ND1 is applied to the gate of the transistor Q3, the transistor Q3 operates in the state in which the transistor Q3 is diode-connected.

As a result, the current, which flows from the source line CELSRC via the NAND string NS and bit line BL, flows into the node SASRC via the transistors Q4, Q1 and Q3 in the named order. If a certain length of time has passed since time instant t2, the voltage of the bit line BL and the potential of the node ND2 between the transistors Q1 and Q3 are stabilized.

Then, at time instant t3, the sequencer 13 sets the transistors Q1 and Q4 in the OFF state, and sets the voltage of the control signal Φ2 to be equal to the voltage of the control signal Φ1 at time instant t1. Concretely, the voltage of the control signal Φ2 is set at "voltage of node SASRC+ threshold voltage of transistor Q2+overdrive voltage Vov".

Thereby, the voltage of the node ND2 is kept equal to the voltage at time instant t1. On the other hand, since the transistors Q1 and Q4 are set in the OFF state, the node ND1 enters a high-impedance state, and the voltage of the node ND1 is kept at the voltage before time instant t3.

At time instant t3, since the voltage of the control signal Φ2 is controlled to be equal to the voltage of the control signal Φ1 at time instant t1, the voltage of the node ND2 is also kept. Specifically, the transistor Q3, which is connected between the node ND1 and node ND2, passes the same current as the cell current even after time instant t3, and the copied cell current flows from the node SEN to the node SASRC via the transistors Q2 and Q3.

At time instant t3, the voltage of the bit line BL is varied, based on the data stored in the memory cell transistor MT of the read target in the NAND string NS. Thus, the current flowing from the node SEN to the node SASRC after time instant t3 also varies, and the potential of the node SEN is determined in accordance with the amount of the flowing current.

Then, by sensing the voltage of the node SEN, the sense amplifier section SA determines whether the memory cell transistor MT of the read target stores "0" data or "1" data.

Note that, at time instant t3, the sequencer 13 controls the control signals Φ1 and Φ2, so that the potentials of the nodes ND1 and ND2 may not vary before and after the ON/OFF switching of the transistors Q1 and Q2. Thereby, even if the ON/OFF of the transistors Q1 and Q2 is switched, the amount of current flowing between the drain and source of the transistor Q3 becomes substantially equal.

As described above, in the semiconductor memory device 1 according to the first embodiment, the sense amplifier section SA can determine the data stored in the memory cell transistor MT. This read operation is called, e.g. "DSA (Diode sense ABL) method".

Operation Example of the Sense Amplifier Unit SAU

Next, a description is given of an example of the operation of the sense amplifier unit SAU described with reference to FIG. 9, in the read operation of the semiconductor memory device 1 according to the first embodiment.

Figure 11:
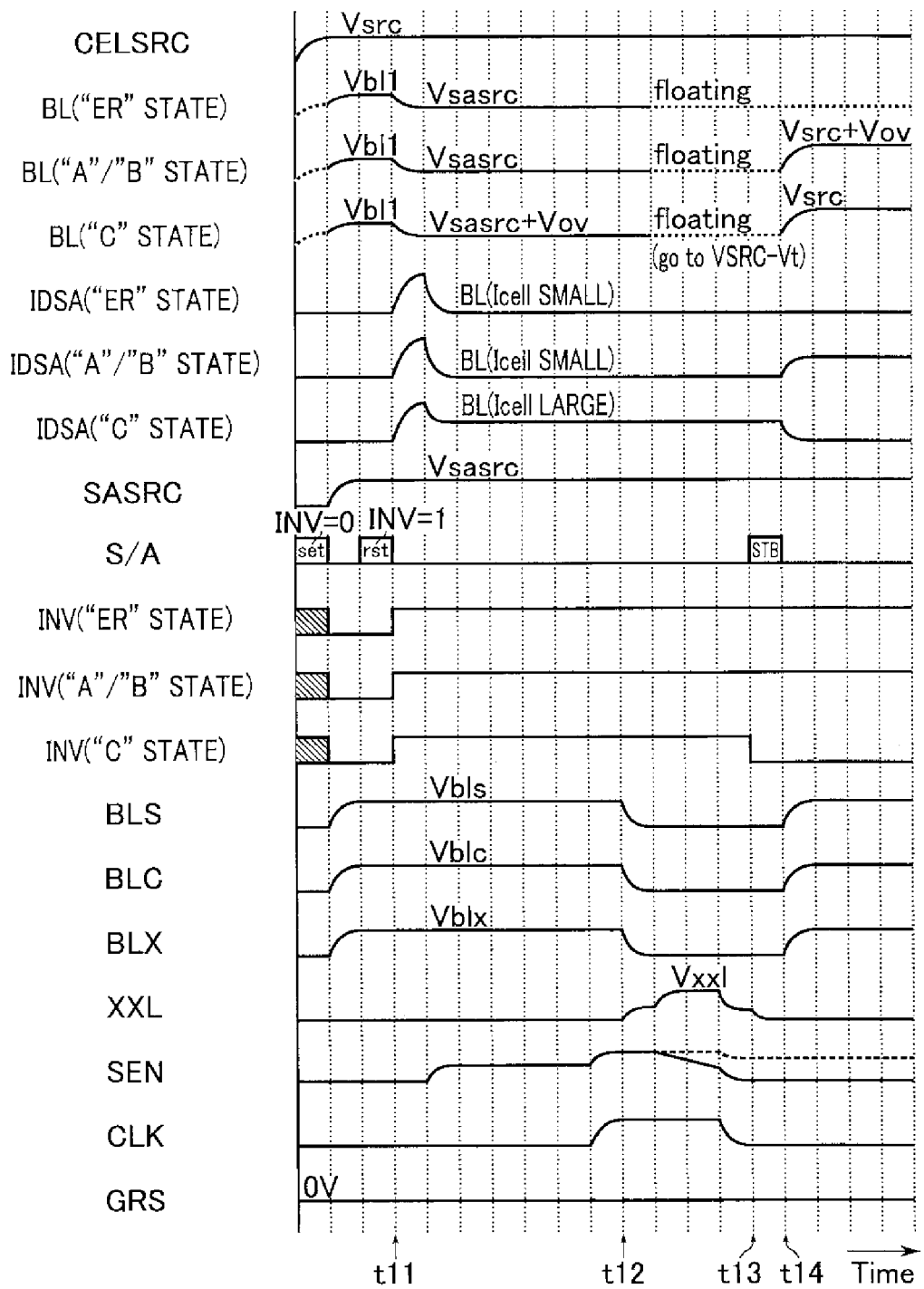
FIG. 11 is a timing chart illustrating an example of the read operation in the semiconductor memory device according to the first embodiment.

FIG. 11 illustrates an example of the operation of the sense amplifier unit SAU, in the read operation in the semiconductor memory device 1 according to the first embodiment. The example illustrated in FIG. 11 corresponds to the operation in the case in which a lockout operation is executed after effective data is read, and upper page data is read. In addition, in this read operation, the read is executed in the order of the read voltage CR and read voltage AR. As regards the period illustrated in FIG. 11, FIG. 11 illustrates, in an extracted manner, the read period using the read voltage CR.

The waveforms of IDSA ("C" state), IDSA ("A"/"B" state) and ADSA ("ER" state) are indicative of waveforms of current flowing between the drain and source of the diode-connected transistor Q3 when the "ER" state, "A"/"B" state and "C" state of the memory cell transistor MT are read. The other signal waveforms correspond to voltage waveforms. In the illustrated waveforms corresponding to the ("ER" state), ("A"/"B" state) and ("C" state), the voltages of the corresponding interconnects or nodes are illustrated.

As illustrated in FIG. 11, at the time of the start of the read operation, the sequencer 13 sets the voltage of the node INV at "L" level (INV=0), and the driver module 14 applies Vsrc to the source line CELSRC. Thereafter, the sequencer 13 raises the voltages of the control signals BLS, BLC and BLX up to Vbls, Vblc and Vblx, respectively. Then, the voltage of the bit line BL rises to, e.g. Vbl1, based on the voltage applied to the source line CELSRC, and based on the voltage via the transistors Q7, Q8, Q1 and Q4.

Then, at time instant t11, the sequencer 13 resets the voltage of the node INV from "L" level to "H" level (INV=1). Then, current flows from the source line CELSRC to the node SASRC via the NAND string NS and the transistors Q4, Q1, Q3 and Q6 in the named order, and eventually the voltages of the bit line BL and node ND2 are stabilized.

At this time, as described with reference to FIG. 10, the voltages of the bit line BL and node ND2 are set at voltages corresponding to the data logic of the read target cell in the NAND string NS. For example, each of the voltage of the bit line BL corresponding to the "ER" state and the voltage of the bit line BL corresponding to the "A"/"B" state lowers to Vsasrc. The voltage of the bit line BL corresponding to the "C" state lowers to Vsasrc+Vov. In addition, the node SEN is charged to a desired voltage via the transistors Q9 and Q14.

At time instant t12, the sequencer 13 changes the voltages of the control signals BLS, BLC and BLX to voltages of "L" level, and raises the voltage of the control signal XXL to Vxxl. Then, the transistors Q4, Q1 and Q8 are turned off, and the bit line BL becomes the floating state. In addition, the copied cell current flows from the node SEN into the node SASRC via the transistors Q2, Q3 and Q6.

Thereby, the voltage of the node SEN is discharged by the cell current copied by the transistor Q3. Concretely, when the memory cell transistor MT is in the "C" state, the voltage of the node SEN greatly lowers, as indicated by a solid line in FIG. 11. When the memory cell transistor MT is in the "ER" state, "A" state or "B" state, the voltage of the node SEN is hardly discharged, as indicated by a broken line in FIG. 11. Then, in a time between time instant t13 and time instant t14, the sequencer 13 asserts the control signal STB, thereby causing the latch section LP to latch the logical data corresponding to the voltage of the node SEN.

When the corresponding memory cell transistor MT is in the "C" state, the sequencer 13 causes the latch circuit, which latches this data, to latch "1" data. Then, for example, the sequencer 13 executes a lockout operation in the corresponding sense amplifier unit SAU.

Concretely, the control signals STI, STL, LPCn and LDC are controlled, and, for example, the voltage of the node INV in the latch circuit SDL is fixed at "L" level. Thereby, in the subsequent read using the read voltage AR, the amount of current flowing to the bit line BL, which is connected to the memory cell transistor MT that is finally determined to be in the "C" state, can be suppressed.

As described above, in the semiconductor memory device 1 according to the first embodiment, the sense amplifier unit SAU can determine the data stored in the memory cell transistor MT. In the meantime, in the present specification, the case was illustrated in which the DSA (Diode sense ABL) method is applied to the determination of data.

Alternatively, an ABL (All Bit Line) method may be applied to the determination method of data.

No matter which method is adopted, in the semiconductor memory device 1 according to the first embodiment, the sense amplifier module 16 can read the data stored in the memory cell transistor MT, in accordance with the amount of current flowing from the bit line BL.

In the above-described read operation, the case was illustrated in which the sequencer 13 executes the lockout operation on the bit line BL corresponding to the memory cell transistor MT with the data that is finally determined. However, the lockout operation may not be executed. The setting as to whether or not the lockout operation is executed in the read operation of the semiconductor memory device 1 according to the first embodiment may be freely changed.

[1-2-2] Erase Verify Operation

The semiconductor memory device 1 according to the first embodiment executes an erase verify operation after executing an erase operation. The erase operation is an operation of transitioning the threshold voltage of the memory cell transistor MT from the state after write to the "ER" state. The erase verify operation is a read operation for confirming whether the threshold voltage of the memory cell transistor MT is distributed in the "ER" state by the erase operation.

In addition, the semiconductor memory device 1 according to the first embodiment can execute an erase verify operation in units of the block BLK and an erase verify operation in units of the string unit SU by a read operation using hole conduction. Specifically, in the erase verify operation, the select transistors ST1 and ST2, memory cell transistors MT and dummy transistors DT operate as PMOS transistors.

Hereinafter, the erase verify operation in units of the block BLK and the erase verify operation in units of the string unit SU in the semiconductor memory device 1 according to the first embodiment will successively be described.

(Erase Verify Operation in Units of Block BLK)

Figure 12:
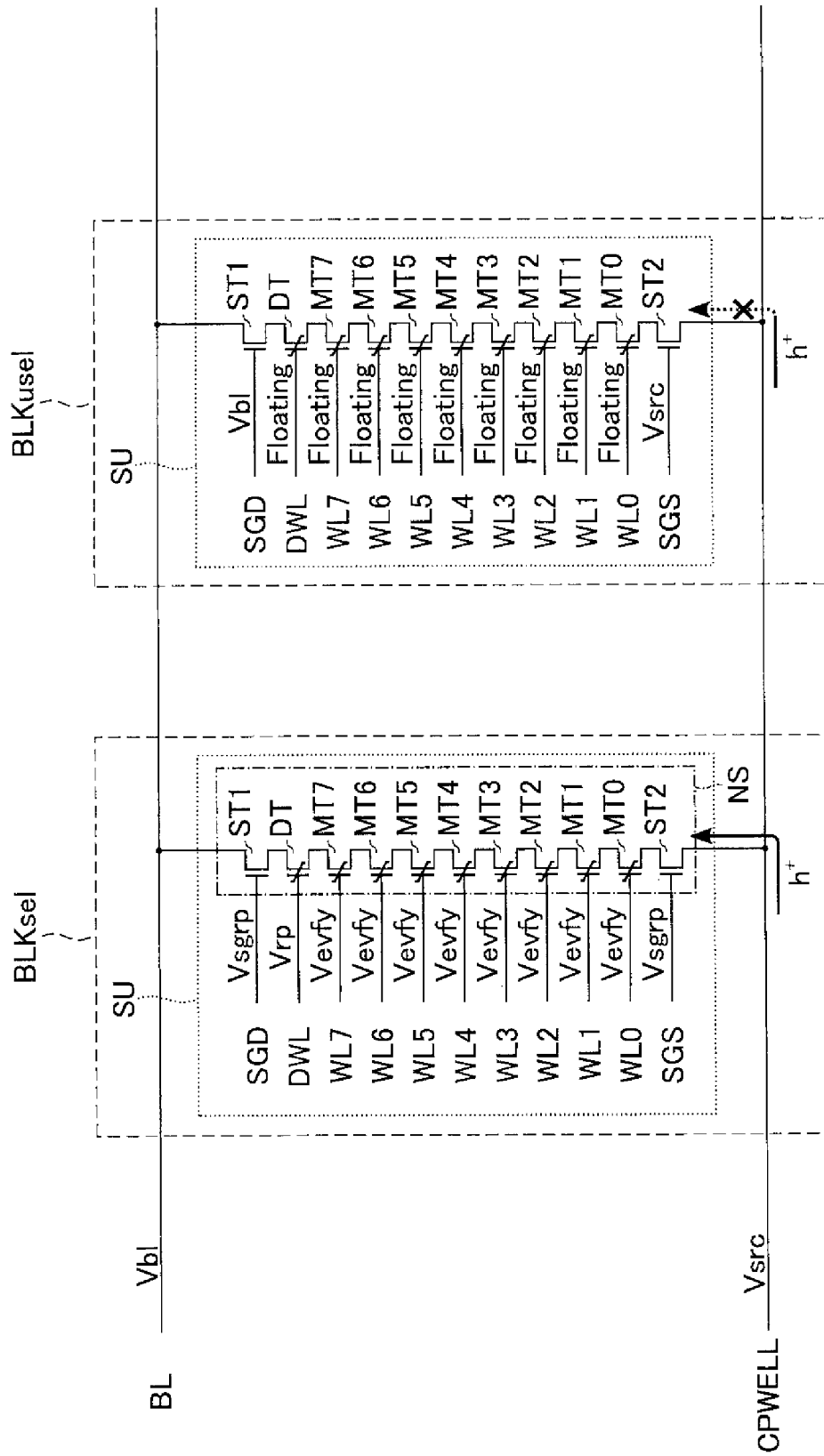
FIG. 12 is a circuit diagram of the memory cell array, FIG. 12 illustrating an example of voltages used in an erase verify operation in units of a block in the semiconductor memory device according to the first embodiment.

FIG. 12 is a circuit diagram of the memory cell array 10 included in the semiconductor memory device 1 according to the first embodiment. FIG. 12 illustrates an example of voltages used in the erase verify operation in units of the block BLK. The circuit diagram used in the following description of the erase verify operation illustrates, in an extracted manner, as appropriate, the string unit SU and NAND string NS in a block BLK that is an erase target, and the string unit SU and NAND string NS in a block BLK that is not an erase target.

In the description below, a selected block BLK that is the erase target is referred to as "selected block BLKsel", and an unselected block BLK that is not the erase target is referred to as "unselected block BLKusel". In addition, in the description below, it is assumed that the threshold voltages of the memory cell transistors MT0 to MT7 are included in the "ER" state.

As illustrated in FIG. 12, in the erase verify operation in units of the block BLK in the first embodiment, the sense amplifier unit SAU applies Vbl to the bit line BL, and the driver module 14 applies Vsrc to the well line CPWELL. Here, in the erase verify operation, the voltage of the well line CPWELL is controlled to be higher than the voltage of the bit line BL.

In addition, in the selected block BLKsel, the driver module 14 and row decoder module 15 apply Vsgrp to the select gate line SGD, Vevfy to each of the word lines WL0 to WL7, apply Vrp to the dummy word line DWL, and apply Vsgrp to the select gate line SGS. This operation is identical among the string units SU in the selected block BLKsel. Specifically, in the selected block BLKsel, Vsgrp is applied to each of the select gate lines SGD0 to SGD3.

The voltage Vevfy is an erase verify voltage, and is a voltage between the "ER" state and "A" state. Specifically, when the memory cell transistor MT, to the gate of which Vevfy was applied, is turned on, this indicates that the threshold voltage of this memory cell transistor MT is distributed in the "ER" state. The voltage Vsgrp is a voltage which is lower than Vsrc and is lower than Vevfy. The voltage Vrp is a voltage which is lower than Vsrc and is lower than Vevfy.

Each of the select transistors ST1 and ST2, to the gates of which Vsgrp was applied, and the dummy transistor DT, to the gate of which Vrp was applied, is turned on. Each of the memory cell transistors MT0 to MT7, to the gates of which Vevfy was applied, is turned on or off in accordance with the threshold voltage.

On the other hand, in the unselected block BLKusel, the driver module 14 and row decoder module 15 apply Vbl to each select gate line SGD, and apply Vsrc to the select gate line SGS. The select transistor ST1, to the gate of which Vbl was applied, is turned off since the voltage of the bit line BL is Vbl. This operation is identical among the string units SU in the unselected block BLKusel. Specifically, in the unselected block BLKusel, Vbl is applied to each of the select gate lines SGD0 to SGD3.

The select transistor ST2, to the gate of which Vsrc is applied, is turned off since the voltage of the well line CPWELL is Vsrc. Accordingly, in the unselected block BLKusel, the channel of each of the memory cell transistors MT and dummy transistor DT, which are connected between the select gate transistors ST1 and ST2, is set in a floating state.

When the voltages are applied as described above, current can flow from the well line CPWELL toward the bit line BL by hole conduction in the NAND string NS in the selected block BLKsel. On the other hand, in the NAND string NS in the unselected block BLKusel, no current flows from the well line CPWELL toward the bit line BL by hole conduction.

As a result, the semiconductor memory device 1 according to the first embodiment can confirm whether the threshold voltage of the memory cell transistor MT included in the NAND string NS in the selected block BLKsel in the erase state ("ER" state) or not. Concretely, in the erase verify operation using hole conduction, the memory cell transistor MT with the threshold voltage lower than Vevfy is turned off, and the memory cell transistor MT with the threshold voltage equal to or higher than Vevfy is turned off.

For example, in the erase verify operation, in the NAND string NS in which all memory cell transistors MT are in the ON state, current flows via the NAND string NS from the well line CPWELL to the bit line BL. On the other hand, in the NAND string NS including a memory cell transistor MT that is in the OFF state, no current flows via the NAND string NS from the well line CPWELL to the bit line BL.

From the above, since current between the bit line BL and source line CELSRC flows through the bit line BL which is connected to the NAND string NS in which all memory cell transistors MT are in the ON state, the semiconductor memory device 1 according to the first embodiment deems that the erase verify operation of the NAND string NS corresponding to this bit line BL is passed.

On the other hand, since current between the bit line BL and source line CELSRC does not flow through the bit line BL which is not connected to the NAND string NS in which all memory cell transistors MT are in the ON state, the semiconductor memory device 1 according to the first embodiment deems that the erase verify operation of the NAND string NS corresponding to this bit line BL is failed.

(Erase Verify Operation in Units of String Unit SU)

Figure 13:
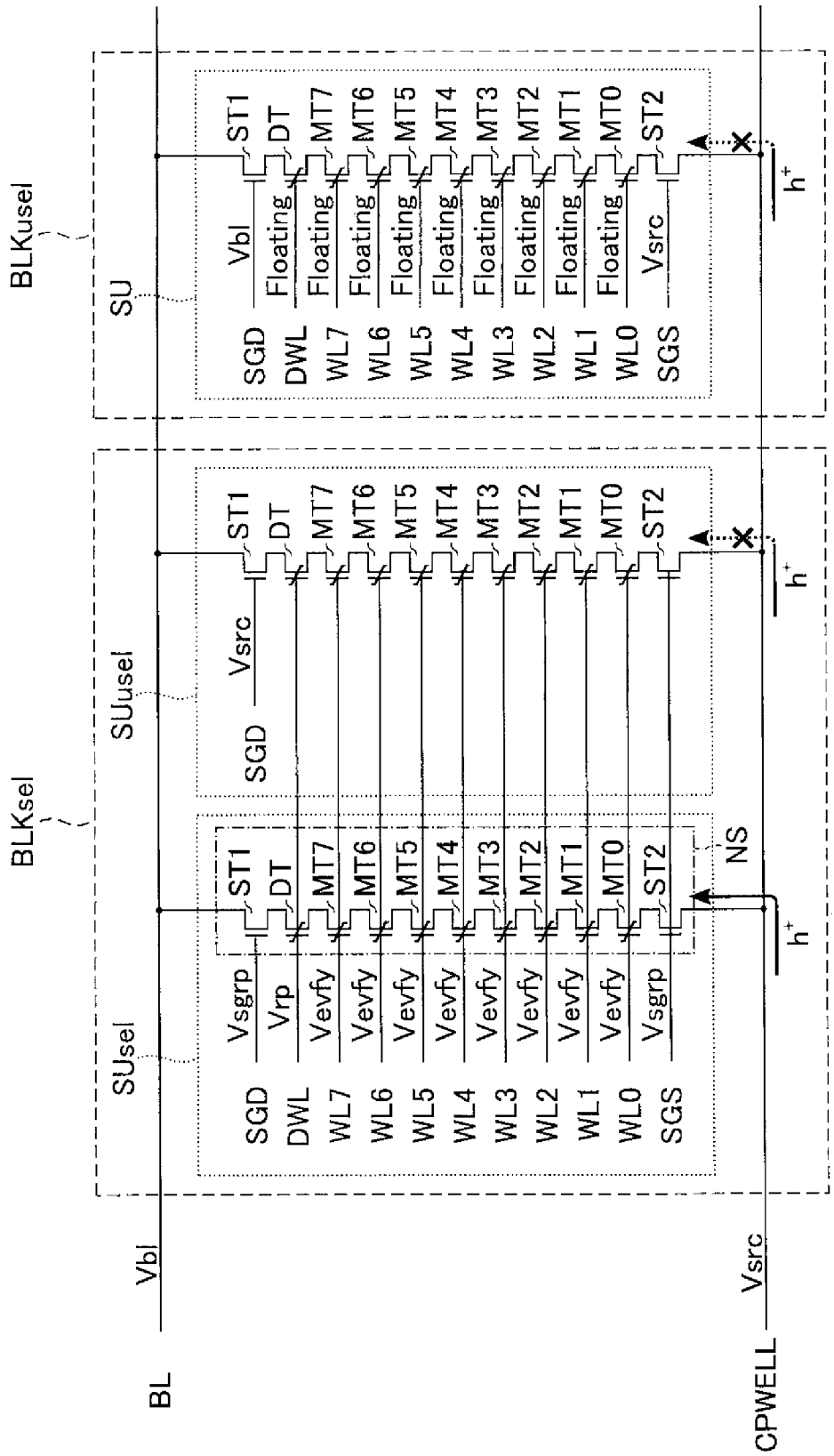
FIG. 13 is a circuit diagram of the memory cell array, FIG. 13 illustrating an example of voltages used in an erase verify operation in units of a string unit in the semiconductor memory device according to the first embodiment.

FIG. 13 is a circuit diagram of the memory cell array 10 included in the semiconductor memory device 1 according to the first embodiment. FIG. 13 illustrates an example of voltages used in the erase verify operation in units of the string unit SU. In the description below, a string unit SU that is an erase verify target in the selected block BLKsel is referred to as "selected string unit SUsel", and a string unit SU that is not an erase verify target in the selected block BLKsel is referred to as "unselected string unit SUusel".

As illustrated in FIG. 13, in the erase verify operation in units of the string unit SU in the first embodiment, like the erase verify operation in units of the block BLK, the sense amplifier unit SAU applies Vbl to the bit line BL, and the driver module 14 applies Vsrc to the well line CPWELL.

In addition, in the selected block BLKsel, the driver module 14 and row decoder module 15 apply Vsgrp to the select gate line SGD in the selected string unit SUsel, and Vsrc to the select gate line SGD in the unselected string unit SUusel. The select transistor ST1, to the gate of which Vsrc was applied in the selected block BLKsel, is turned off.

As a result, in the selected block BLKsel, current can flow from the well line CPWELL toward the bit line BL by hole conduction in the NAND string NS in the selected string unit SUsel. On the other hand, in the selected block BLKsel, no current flows from the well line CPWELL toward the bit line BL by hole conduction in the NAND string NS in the unselected string unit SUusel.

Since the other operations in the above-described erase verify operation in units of the string unit SU in the first embodiment are similar to those in the erase verify operation in units of the block BLK, a description thereof is omitted. Thereby, the semiconductor memory device 1 according to the first embodiment can execute the erase verify operation in units of the string unit SU.

In the erase verify operation in units of the string unit SU, the voltage applied to the select gate line SGD, which corresponds to the unselected string unit SUusel in the selected block BLKsel, is not limited to Vsrc. It should suffice if at least a voltage, which is equal to or higher than the voltage applied to the well line CPWELL, is applied to the select gate line SGD in the unselected string unit SUusel.

[1-3] Advantageous Effects of the First Embodiment

According to the above-described semiconductor memory device 1 of the first embodiment, it is possible to enhance the erase performance in the NAND flash memory (FeNAND) which uses a ferroelectric material for a memory layer. The advantageous effects of the semiconductor memory device 1 according to the first embodiment will be described below in detail.

Figure 14:
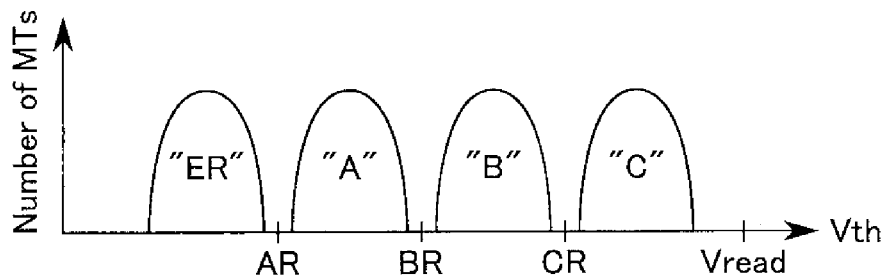
FIG. 14 is a threshold distribution diagram illustrating an example of threshold distributions and verify voltages of memory cell transistors in a comparative example of the first embodiment.

FIG. 14 illustrates, as a comparative example of the first embodiment, an example of threshold distributions of memory cell transistors each using a floating gate as a memory layer.

As illustrated in FIG. 14, the threshold distributions of memory cell transistors in the comparative example of the first embodiment differ from the threshold distributions of memory cell transistors MT described in the first embodiment with reference to FIG. 5, with respect to the position of the threshold distribution corresponding to the erase state.

Specifically, in the memory cell transistor MT using the ferroelectric material, the threshold distribution with the highest threshold voltage corresponds to the erase state. On the other hand, in the memory cell transistor MT using the floating gate, the threshold distribution with the lowest threshold voltage corresponds to the erase state. Accordingly, in the threshold distributions of memory cell transistors in the comparative example of the first embodiment, the threshold distributions are formed in the order of the "ER" state, "A" state, "B" state and "C" state in the order from the lowest threshold voltage, and the read voltages are set as appropriate.

Figure 15:
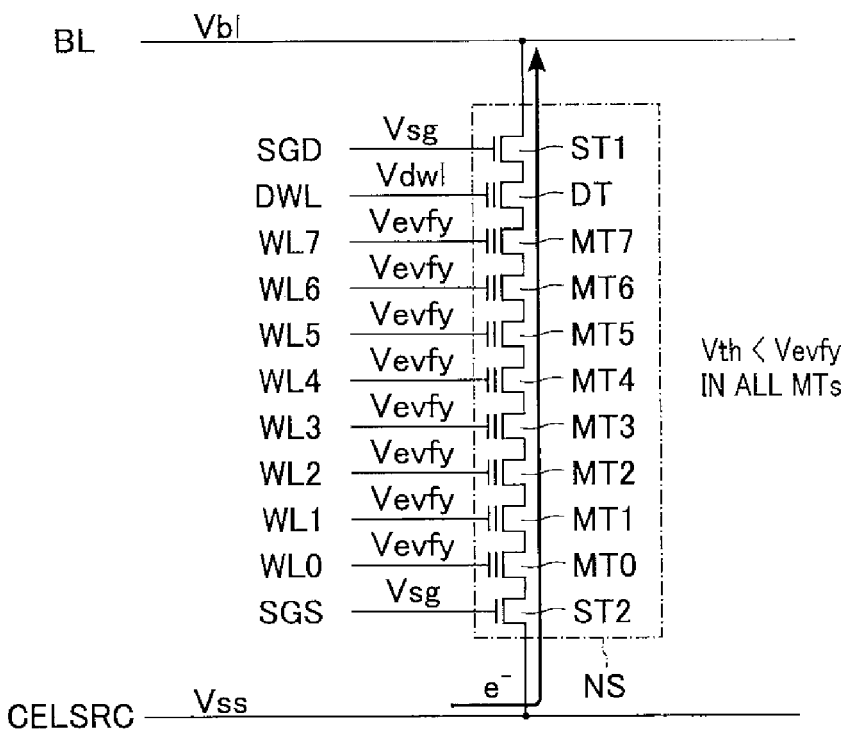
FIG. 15 is a circuit diagram of the memory cell array, FIG. 15 illustrating an example of voltages used in a verify operation using electron conduction in the comparative example of the first embodiment.

FIG. 15 illustrates a circuit configuration of a NAND string NS using memory cell transistors in the comparative example of the first embodiment. FIG. 15 illustrates an example of the operation in the case in which a verify operation using electron conduction is executed.

As illustrated in FIG. 15, in the verify operation using electron conduction, Vbl is applied to the bit line, Vss is applied to the source line CELSRC, Vsg is applied to the select gate lines SGD and SGS, Vdwl is applied to the dummy word line DWL, and Vevfy is applied to the word lines WL0 to WL7.

The voltage Vbl is a voltage higher than Vss. The voltage Vsg is a voltage higher than Vbl. The voltage Vdwl is a voltage at which the dummy transistor DT is turned on. If the voltages are applied in this manner, electrons can flow from the source line CELSRC toward the bit line BL, in accordance with the threshold voltage of the memory cell transistor MT in the NAND string NS.

For example, when all memory cell transistors MT0 to MT7 are in the ON state, i.e. when the threshold voltage Vth is lower than Vevfy in all memory cell transistors MT in the NAND string NS, electrons flow from the source line CELSRC toward the bit line BL via the NAND string NS.

In this manner, in the comparative example of the first embodiment, the erase verify operation using electron conduction is executed, and thereby it is determined whether the erase verify is passed or not, based on whether all memory cell transistors MT in the NAND string NS are in the ON state or not. In other words, in the comparative example of the first embodiment, the erase verify operation for the memory cell transistors MT in the NAND string NS can be executed batchwise, and the erase verify operation can be executed in units of the block BLK or in units of the string unit SU.

On the other hand, when the verify operation using electron conduction is executed on the memory cell transistors MT in the first embodiment, it is determined whether the erase verify is passed or not, based on the fact that all memory cell transistors MT are set in the OFF state.

Figure 16:
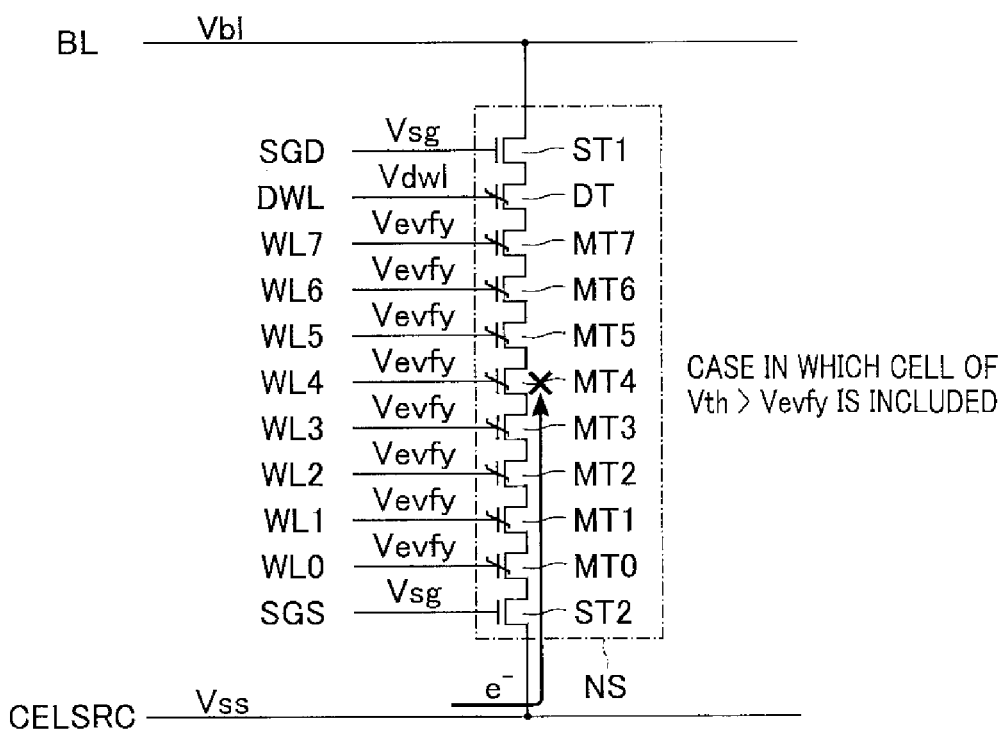
FIG. 16 is a circuit diagram of the memory cell array, FIG. 16 illustrating an example of voltages used in a verify operation using electron conduction in the semiconductor memory device according to the first embodiment.

FIG. 16 illustrates a circuit configuration of the NAND string NS using the memory cell transistors MT in the semiconductor memory device 1 according to the first embodiment. FIG. 16 illustrates, like the comparative example, an example of the operation in the case in which a verify operation using electron conduction is executed.

As illustrated in FIG. 16, when the erase verify operation using electron conduction was executed in the semiconductor memory device 1 according to the first embodiment, if the NAND string NS of the verify target includes even one memory cell transistor MT that is in the OFF state, it is deemed that the erase verify is passed. In other words, even when many memory cell transistors MT, which are not distributed in the "ER" state, are included in the memory cell transistors MT in the NAND string NS, it would be deemed that the erase verify is passed.

Thus, when the semiconductor memory device 1 according to the first embodiment uses the erase verify operation using electron conduction, it is preferable to execute the erase verify in units of the word line WL, in order to improve the precision of the erase verify. However, the number of times of execution of the erase verify operation in units of the word line WL becomes greater as the number of word lines WL becomes larger, and this may become a factor of the deterioration of the erase performance of the semiconductor memory device 1.

Taking the above into account, the semiconductor memory device 1 according to the first embodiment uses the verify operation in which hole conduction is used for the erase verify operation. In the verify operation using hole conduction, the memory cell transistor MT having a higher threshold voltage than the verify voltage is set in the ON state.

Specifically, the semiconductor memory device 1 according to the first embodiment uses the erase verify operation which uses hole conduction. Thereby, like the comparative example of the first embodiment, it becomes possible to determine whether the erase verify is passed or not, based on whether all memory cell transistors MT in the NAND string NS are set in the ON state or not.

As a result, the semiconductor memory device 1 according to the first embodiment can execute the erase verify operation in units of the block BLK or in units of the string unit SU. Accordingly, the semiconductor memory device 1 according to the first embodiment can enhance the erase performance in the NAND flash memory using a ferroelectric material for a memory layer.

In the erase verify operation in units of the block BLK, the semiconductor memory device 1 according to the first embodiment deems that the erase verify is passed, when current flows through the NAND string NS in at least one string unit SU.

However, what is determined in the erase verify is the lower end of the distribution created by the memory cell transistors MT included in the string unit SU. In the characteristics of the distribution including a plurality of memory cell transistors MT, the difference in characteristic among the individual memory cell transistors MT is averaged to some extent. Thus, in the semiconductor memory device 1 according to the first embodiment, it can be estimated that the difference in characteristic among the string units SU is small. Therefore, the semiconductor memory device 1 according to the first embodiment can ensure the reliability of erase verify, even in the erase verify operation in units of the block BLK.

[2] Second Embodiment

A semiconductor memory device 1 according to a second embodiment differs from the semiconductor memory device 1 according to the first embodiment with respect to the connection relation of select gate lines SGS, and performs the same erase verify operation as the first embodiment. Hereinafter, as regards the semiconductor memory device 1 according to the second embodiment, different points from the first embodiment will be described.

[2-1] Configuration of Memory Cell Array 10

FIG. 17 illustrates an example of a circuit configuration of a memory cell array 10 included in the semiconductor memory device 1 according to the second embodiment. The circuit configuration of this memory cell array 10 differs from the circuit configuration of the memory cell array 10 described in the first embodiment with respect to the connection relation of select gate lines SGS. Concretely, as illustrated in FIG. 17, the memory cell array 10 in the second embodiment is provided with four select gate lines SGS0 to SGS3. The select gate lines SGS0 to SGS3 are commonly connected to the select transistors ST2 in the string units SU0 to SU3, respectively.

Specifically, in the memory cell array 10 in the second embodiment, the select gate line SGS is isolated in each of the string units SU. The driver module 14 and row decoder module 15 can independently control the voltage which is applied to the select gate line SGS corresponding to a selected string unit SUsel, and the voltage which is applied to the select gate line SGS corresponding to an unselected string unit SUusel.

Figure 18:
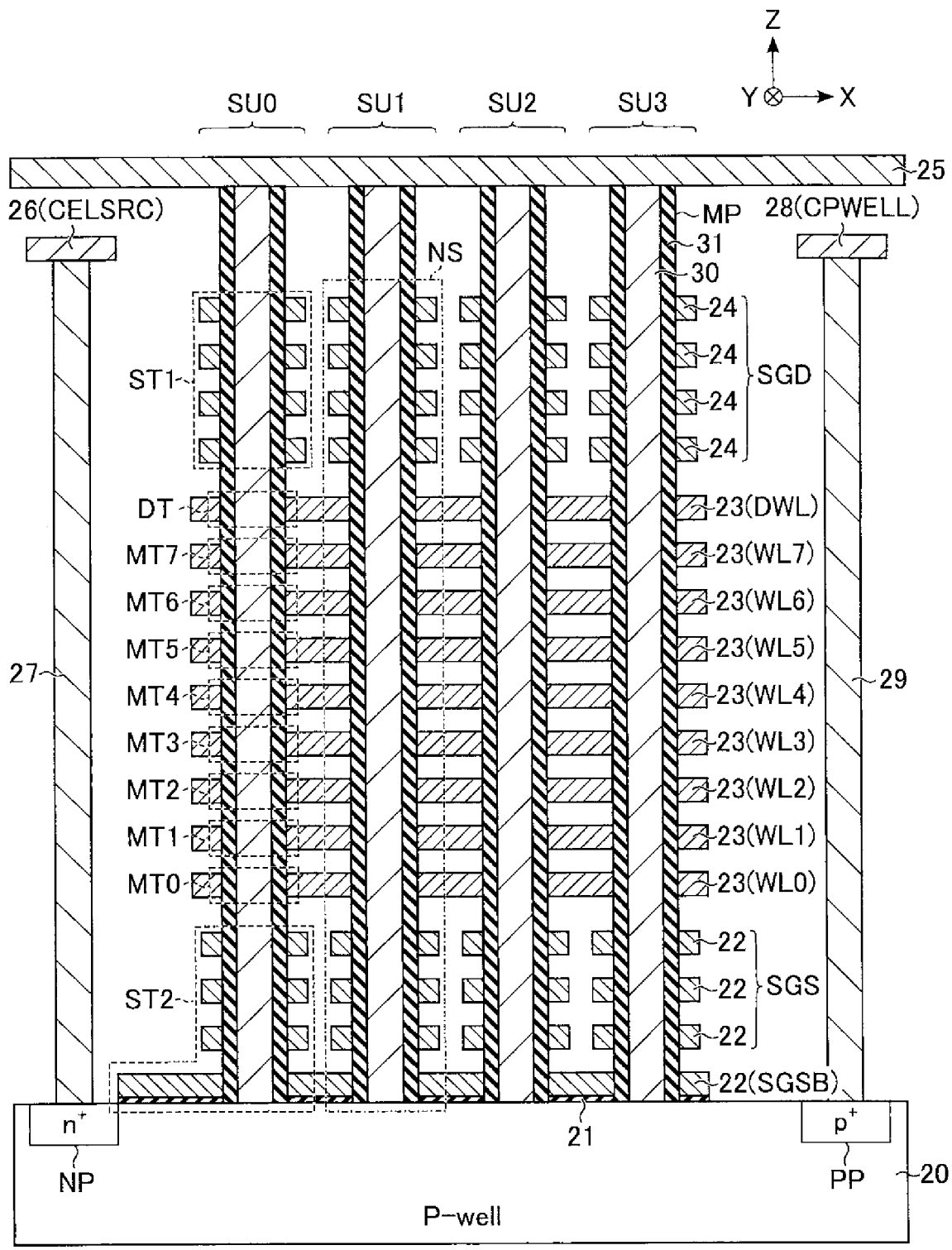
FIG. 18 is a cross-sectional view illustrating an example of a cross-sectional structure of the memory cell array included in the semiconductor memory device according to the second embodiment.

FIG. 18 illustrates an example of a cross-sectional structure of the memory cell array 10 included in the semiconductor memory device 1 according to the second embodiment. The cross-sectional structure of this memory cell array 10 differs from the cross-sectional structure of the memory cell array 10 described in the first embodiment with respect to the structure of conductor layers corresponding to the select gate lines SGS. Concretely, as illustrated in FIG. 18, in the second embodiment, a region corresponding to the memory cell array 10 includes conductor layers 22 which are isolated for the respective string units SU. In other words, the memory pillar MP corresponding to each of the string units SU0 to SU3 penetrates the electrically isolated conductor layer 22.

In this example, like the first embodiment, the conductor layer 22 corresponding to the lowermost conductor layer 22 is provided as one piece. This conductor layer 22 is an interconnect for passing a current via the P-well region 20 between the source line CELSRC and NAND string NS, and the lowermost conductor layer 22, for example, can be independently controlled as a select gate line SGSB. In this case, the three conductor layers 22, which are provided above the conductor layer 22 corresponding to the select gate line SGSB, are used as the select gate lines SGS described with reference to FIG. 17.

The other circuit configuration and cross-sectional structure of the above-described memory cell array 10 in the second embodiment are the same as the circuit configuration and cross-sectional structure of the memory cell array 10 described in the first embodiment. In addition, since the other configuration in the semiconductor memory device 1 according to the second embodiment is the same as the configuration of the semiconductor memory device 1 according to the first embodiment, a description thereof is omitted.

[2-2] Ease Verify Operation (Erase Verify Operation in Units of Block BLK)

Figure 19:
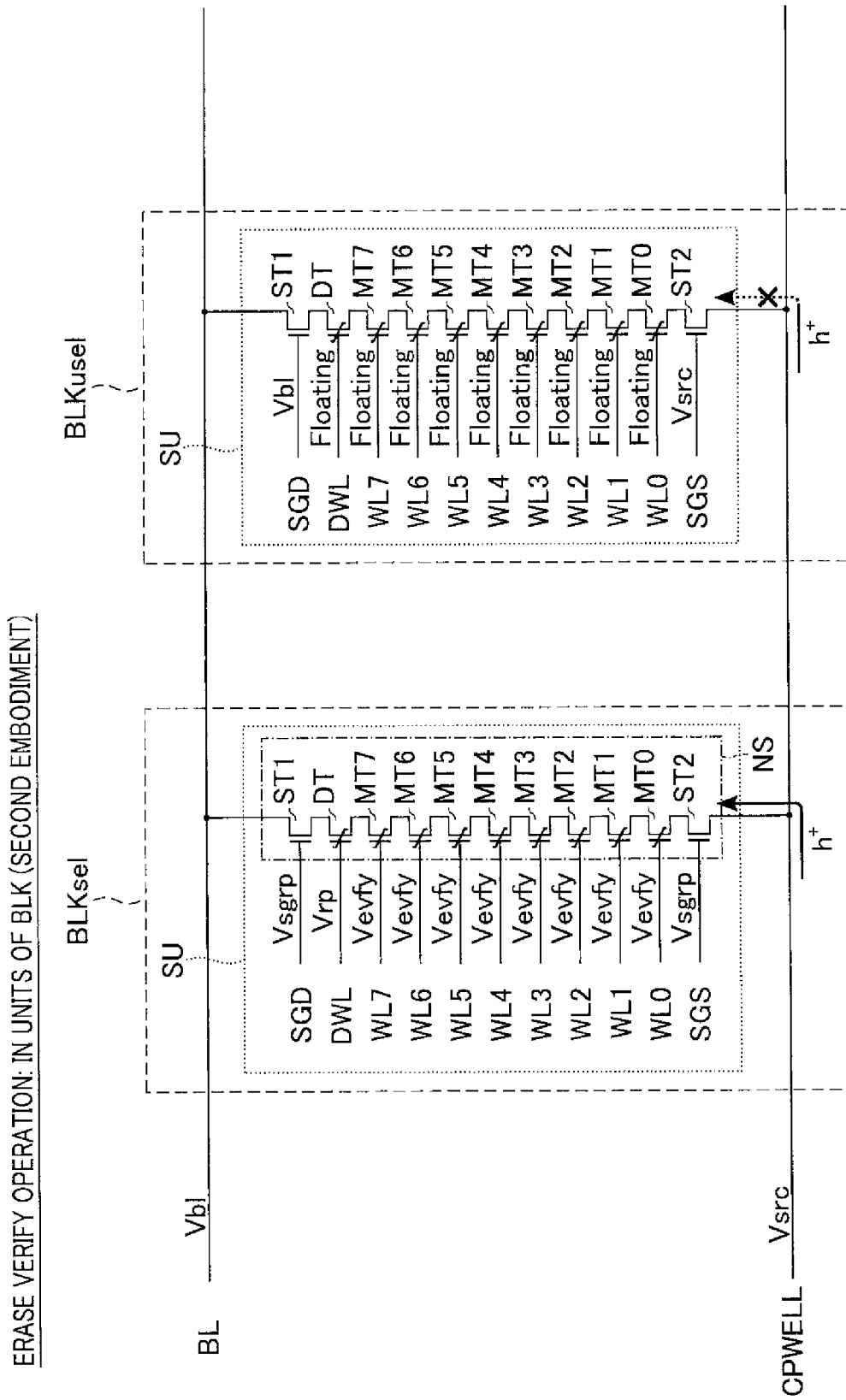
FIG. 19 is a circuit diagram of the memory cell array, FIG. 19 illustrating an example of voltages used in an erase verify operation in units of a block in the semiconductor memory device according to the second embodiment.

FIG. 19 is a circuit diagram of the memory cell array 10 included in the semiconductor memory device 1 according to the second embodiment. FIG. 19 illustrates an example of voltages used in the erase verify operation in units of the block BLK. As illustrated in FIG. 19, in the erase verify operation in units of the block BLK in the second embodiment, like the erase verify operation in units of the block BLK described in the first embodiment, the sense amplifier unit SAU applies Vbl to the bit line BL, and the driver module 14 applies Vsrc to the well line CPWELL.

In addition, in the selected block BLKsel, the driver module 14 and row decoder module 15 apply Vsgrp to the select gate line SGD, Vevfy to each of the word lines WL0 to WL7, apply Vrp to the dummy word line DWL, and apply Vsgrp to the select gate line SGS. This operation is identical among the string units SU in the selected block BLKsel. Specifically, in the selected block BLKsel, Vsgrp is applied to each of the select gate lines SGD0 to SGD3 and SGS0 to SGS3.

As described above, in the erase verify operation in units of the block BLK in the second embodiment, the conditions of voltages applied to the interconnects corresponding to the selected block BLK are the same as in the erase verify operation in units of the block BLK in the first embodiment.

As a result, in the erase verify operation in units of the block BLK in the second embodiment, the select transistor ST2 in the selected block BLKsel operates in the same manner as in the erase verify operation in units of the block BLK in the first embodiment.

Since the other operations in the above-described erase verify operation in units of the block BLK in the second embodiment are the same as in the erase verify operation in units of the block BLK described in the first embodiment, a description thereof is omitted.

(Erase Verify Operation in Units of String Unit SU)

Figure 20:
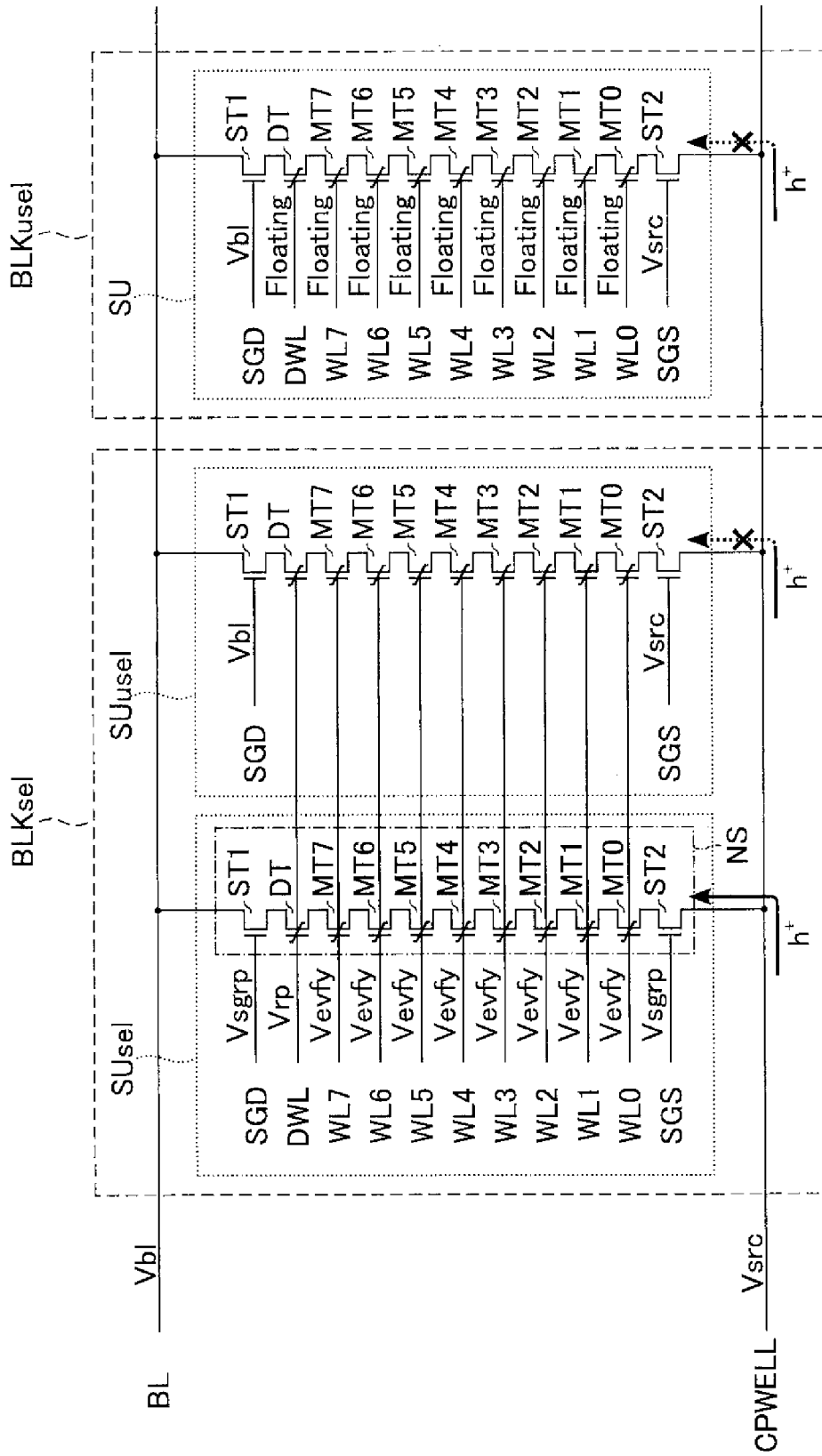
FIG. 20 is a circuit diagram of the memory cell array, FIG. 20 illustrating an example of voltages used in an erase verify operation in units of a string unit in the semiconductor memory device according to the second embodiment.

FIG. 20 is a circuit diagram of the memory cell array 10 included in the semiconductor memory device 1 according to the second embodiment. FIG. 20 illustrates an example of voltages used in the erase verify operation in units of the string unit SU. As illustrated in FIG. 20, in the erase verify operation in units of the string unit SU in the second embodiment, like the erase verify operation in units of the string unit SU described in the first embodiment, the sense amplifier unit SAU applies Vbl to the bit line BL, and the driver module 14 applies Vsrc to the well line CPWELL.

In addition, in the selected block BLKsel, the driver module 14 and row decoder module 15 apply Vsgrp to each of the select gate lines SGD and SGS in the selected string unit SUsel, and Vbl and Vsrc to the select gate lines SGD and SGS in the unselected string unit SUusel, respectively.

Thereby, in the erase verify operation in units of the string unit SU of the second embodiment, the conditions of voltages applied to the select gate lines SGD and SGS corresponding to the unselected string unit SUusel in the selected block BLKsel become the same as the conditions of voltages applied to the select gate lines SGD and SGS in the unselected block BLKusel described in the first embodiment.

As a result, in the unselected string unit SUusel in the selected block BLKsel, the select transistors ST1 and ST2 in each NAND string NS are set in the OFF state, and the unselected string unit SUusel is excluded from the target of the erase verify operation.

Since the other operations in the above-described erase verify operation in units of the string unit SU in the second embodiment are the same as in the erase verify operation in units of the string unit SU described in the first embodiment, a description thereof is omitted.

[2-3] Advantageous Effects of the Second Embodiment

As described above, the semiconductor memory device 1 according to the second embodiment can execute, like the first embodiment, the erase operation in units of the block BLK or in units of the string unit SU, with the circuit configuration different from the first embodiment.

As a result, the semiconductor memory device 1 according to the second embodiment can obtain the same advantageous effects as in the first embodiment, and can enhance the erase performance in the NAND flash memory (FeNAND) which uses a ferroelectric material for a memory layer.

[3] Third Embodiment

In a semiconductor memory device 1 according to a third embodiment, a correction operation of an erase verify voltage is executed in order to enhance the precision of the erase verify operation. Hereinafter, as regards the semiconductor memory device 1 according to the third embodiment, different points from the first and second embodiments will be described.

[3-1] Threshold Voltages of Memory Cell Transistors MT

In some cases, the threshold voltage of the memory cell transistor MT is different between when the memory cell transistor MT is operated by using electron conduction (NMOS operation), and when the memory cell transistor MT is operated by using hole conduction (PMOS operation). In addition, it may be assumed that there is some relationship between the threshold voltage in the NMOS operation and the threshold voltage in the PMOS operation. Qualitatively, it is considered that if the threshold voltage in the NMOS operation increases, the threshold voltage in the PMOS operation also increases.

In the erase verify operations described in the first embodiment and second embodiment, it is detected by using the PMOS operation that the threshold voltage in the NMOS operation has increased to a predetermined level or more. Thus, it is preferable that the erase verify voltage Vevfy is set at such a value that the difference between the threshold voltage in the NMOS operation and the threshold voltage in the PMOS operation is compensated.

Hereinafter, the read operation using electron conduction is referred to as "NMOS read", and the read operation using hole conduction is referred to as "PMOS read".

Figure 21:
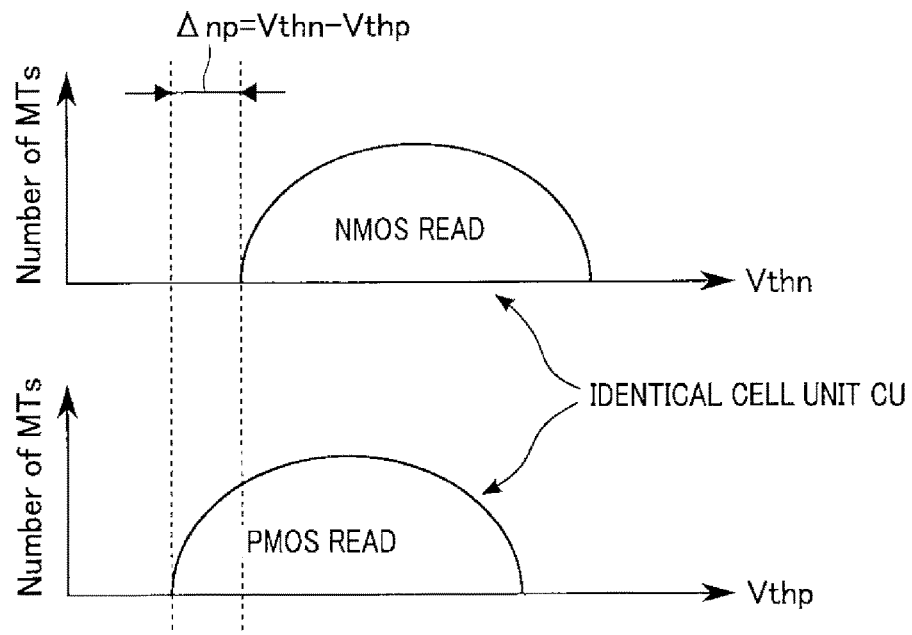
FIG. 21 is a threshold distribution diagram illustrating threshold distributions of memory cell transistors MT, which correspond to NMOS read and PMOS read in a semiconductor memory device according to a third embodiment.

FIG. 21 illustrates threshold distributions of memory cell transistors MT, which correspond to the NMOS read and PMOS read. In the drawings of threshold distributions, which are referred to below, "Vthn" corresponds to the threshold voltage of the memory cell transistor MT in the NMOS read, and "Vthp" corresponds to the threshold voltage of the memory cell transistor MT in the PMOS read.

As illustrated in FIG. 21, in the same cell unit CU, the threshold distribution may differ between when the NMOS read was executed and when the PMOS read was executed. In addition, in FIG. 21, the difference between the threshold voltage in the NMOS read and the threshold voltage in the PMOS read is indicated as $\Delta np$. Specifically, $\Delta np$ is defined by a mathematical expression, $\Delta np = Vthn - Vthp$. Although the $\Delta np$ illustrated in the Figure is indicated as a difference between a lower end of the threshold distribution in the NMOS read and a lower end of the threshold distribution in the PMOS read, this is merely an example. The difference $\Delta np$ may vary with respect to each memory cell transistor MT.

Figure 22:
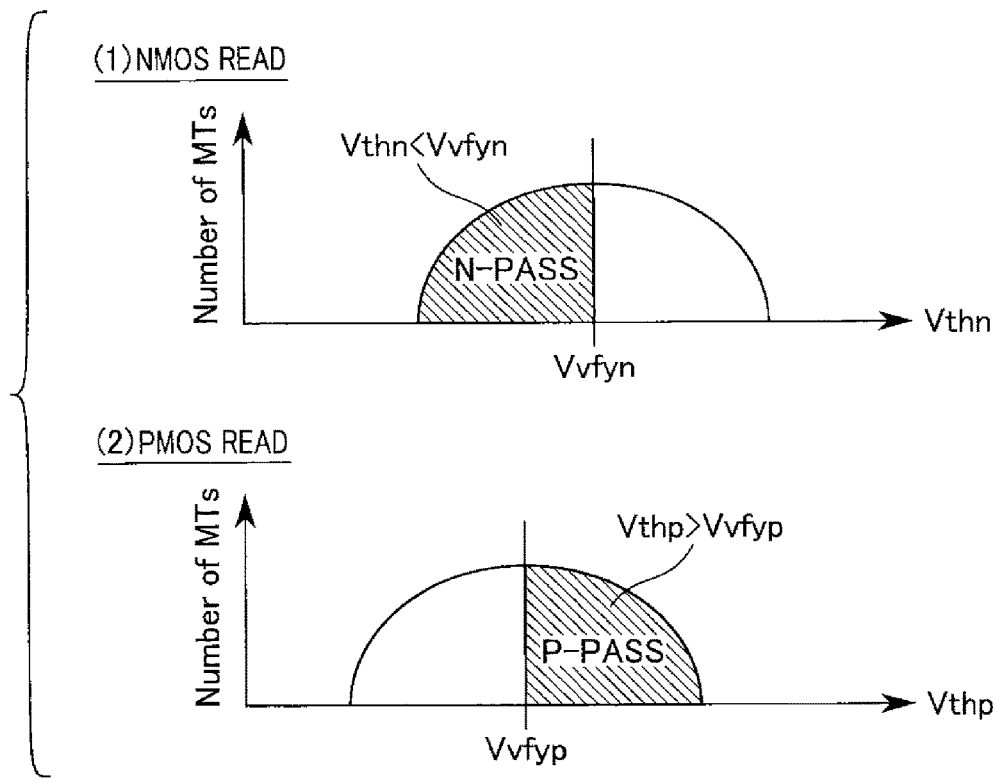
FIG. 22 is a threshold distribution diagram of memory cell transistors, FIG. 22 illustrating definitions of N-PASS and P-PASS in the semiconductor memory device according to the third embodiment.

FIG. 22 illustrates definitions of N-PASS and P-PASS with respect to the threshold distributions of memory cell transistors MT, which correspond to the NMOS read and PMOS read.

As illustrated in part (1) of FIG. 22, in the NMOS read, when a verify voltage Vvfyn is used, the memory cell transistors MT having threshold voltages less than Vvfyn enter the ON state. Hereinafter, the memory cell transistors MT with Vthn<Vvfyn are referred to as memory cell transistors MT of N-PASS. Although not illustrated, the memory cell transistors MT with Vthn Vvfyn are referred to as memory cell transistors MT of N-FAIL.

As illustrated in part (2) of FIG. 22, in the PMOS read, when a verify voltage Vvfyp is used, the memory cell transistors MT having threshold voltages higher than Vvfyp enter the ON state. Hereinafter, the memory cell transistors MT with Vthp>Vvfyp are referred to as memory cell transistors MT of P-PASS. Although not illustrated, the memory cell transistors MT with Vthp Vvfyp are referred to as memory cell transistors MT of P-FAIL.

In addition, in the semiconductor memory device 1 according to the third embodiment, a correction value Vdelta of the read voltage, in which Δnp is taken into account, can be used in the NMOS read and PMOS read.

The correction value Vdelta of Δnp may be stored in the register in the semiconductor memory device 1, or may be stored in the memory cell array 10. The correction value Vdelta of Δnp may be managed by the memory controller 2. The correction value Vdelta of Δnp may be updated for each block BLK, or may be updated for each word line WL, or may be managed by grouping between specific word lines WL and the other word lines WL.

Figure 25:
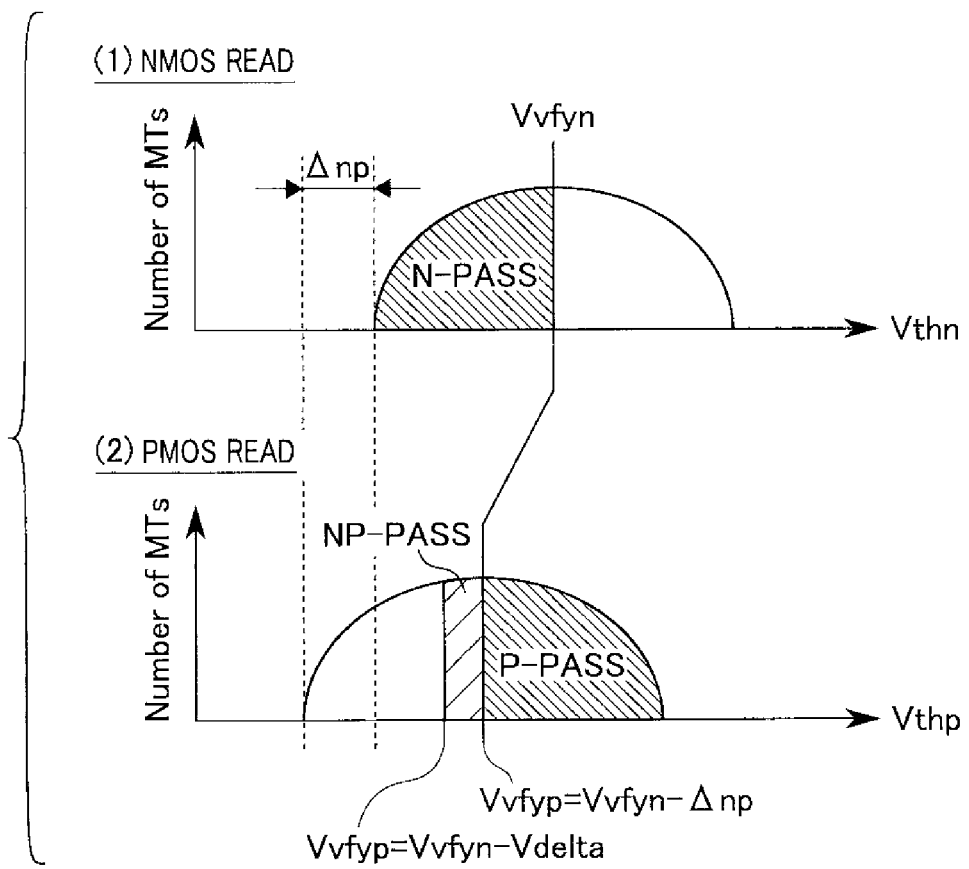
FIG. 25 is a threshold distribution diagram of memory cell transistors, FIG. 25 illustrating an example of results of NMOS read and PMOS read in a case of Vdelta>$\Delta$np, in the semiconductor memory device according to the third embodiment.

FIG. 23, FIG. 24 and FIG. 25 illustrates examples of cases of Vdelta=Δnp, Vdelta<Δnp, and Vdelta>Δnp, in the threshold distributions of memory cell transistors MT, which correspond to the NMOS read and PMOS read. In the present examples, the NMOS read is used as a reference, and Vdelta is used for the PMOS read. In addition, the verify voltage Vvfyp, which is used in the PMOS read, is calculated by, e.g., Vvfyn−Vdelta.

As illustrated in FIG. 23, when Vdelta=Δnp, the memory cell transistors MT of N-PASS in the NMOS read are included in P-FAIL in the PMOS read. Thus, N-PASS and P-PASS are exclusive, and the sum of the number of memory cell transistors MT of N-PASS in the NMOS read and the number of memory cell transistors MT of P-PASS in the PMOS read is substantially equal to the number of memory cell transistors MT included in one cell unit CU.

In other words, when the correction value of Δnp is proper, N-PASS∩P-PASS=0, and N-FAIL∩P-FAIL=0. On the other hand, when the correction value of Δnp is not proper, a bit, which is passed or failed, appears in both NMOS read and PMOS read.

As illustrated in FIG. 24, when Vdelta<Δnp, the sum of the number of memory cell transistors MT of N-PASS in the NMOS read and the number of memory cell transistors MT of P-PASS in the PMOS read is less than the number of memory cell transistors MT included in one cell unit CU.

In this case, the cell unit CU includes a memory cell transistor MT which is "N-FAIL" in the NMOS read and is "P-FAIL" in the PMOS read. Hereinafter, this memory cell transistor MT, which is "verify fail" in each of the NMOS read and PMOS read, is referred to as "memory cell transistor MT of NP-FAIL". NP-FAIL is expressed by, e.g., N-FAIL∩P-FAIL=NP-FAIL≠0.

As illustrated in FIG. 25, when Vdelta>Δnp, the sum of the number of memory cell transistors MT of N-PASS in the NMOS read and the number of memory cell transistors MT of P-PASS in the PMOS read is greater than the number of memory cell transistors MT included in one cell unit CU In this case, the cell unit CU includes a memory cell transistor MT which is "N-PASS" in the NMOS read and is "P-PASS" in the PMOS read. Hereinafter, this memory cell transistor MT, which is "verify pass" in each of the NMOS read and PMOS read, is referred to as "memory cell transistor MT of NP-PASS". NP-PASS is expressed by, e.g., N-PASS∩P-PASS=NP-PASS≠0.

In the semiconductor memory device 1 according to the third embodiment, a proper correction value of Δnp is searched by setting predetermined conditions for the above expressions. The proper correction value of Δnp becomes equal to, for example, the difference between the central value of the threshold distribution in the NMOS read and the central value of the threshold distribution in the PMOS read.

[3-2] Correction Operation

The semiconductor memory device 1 according to the third embodiment can correct, as needed, Vdelta which is used as the correction value for Δnp. This correction operation is executed by selecting a desired word line WL in the block BLK after erase. Hereinafter, the correction operation of Vdelta in the semiconductor memory device 1 according to the third embodiment will be described.

(Flow of the Correction Operation)

Figure 26:
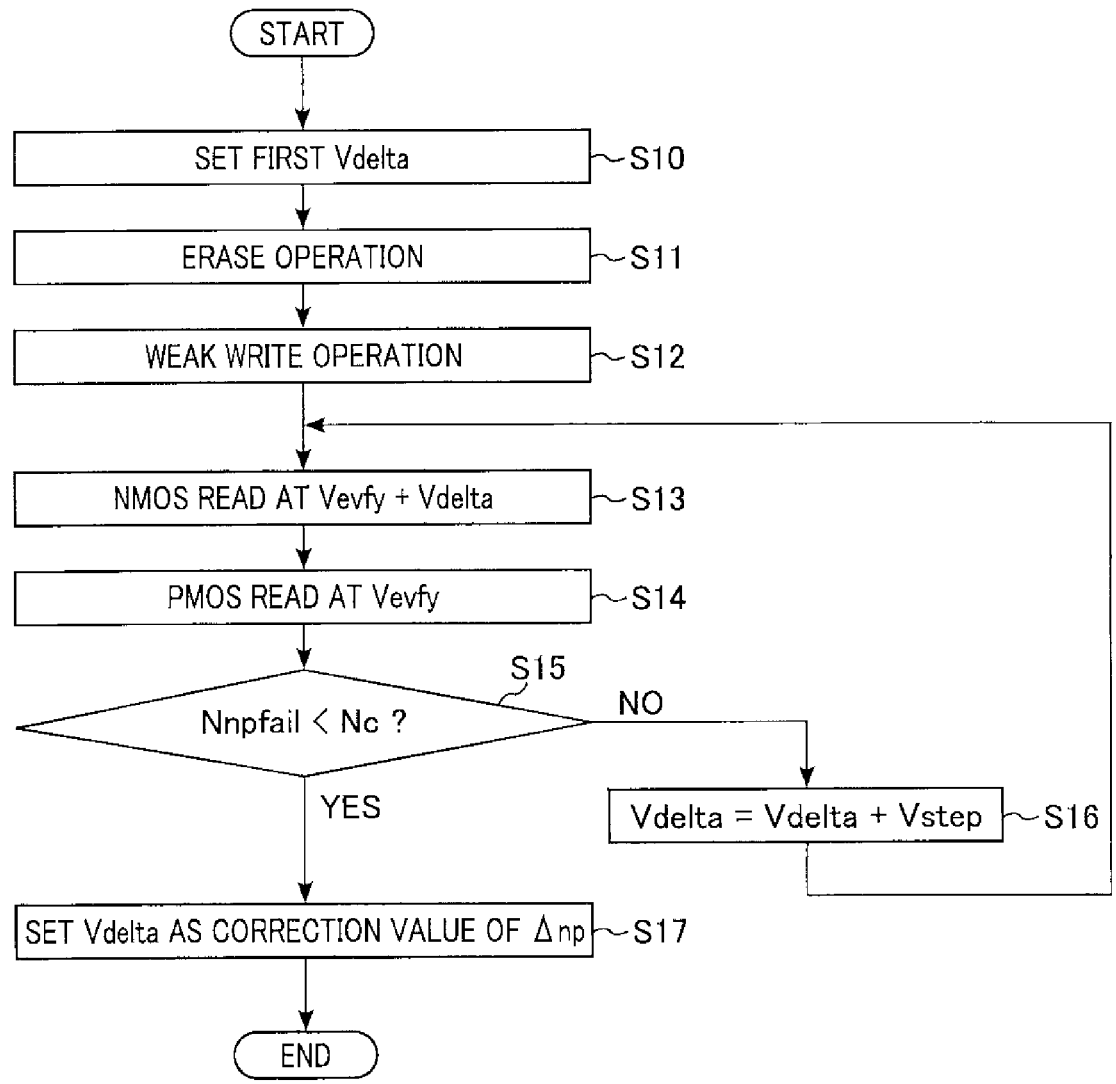
FIG. 26 is a flowchart illustrating an example of a correction operation in the semiconductor memory device according to the third embodiment.

FIG. 26 illustrates an example of a flowchart of the correction operation in the semiconductor memory device 1 according to the third embodiment. As illustrated in FIG. 26, in the correction operation, to start with, the memory controller 2 sets first Vdelta (step S10). The first Vdelta is set at a value which is sufficiently smaller than Δnp, for example, such that a voltage of ideal Vdelta is included in a direction of addition of a step-up voltage Vstep.

Next, the memory controller 2 instructs the semiconductor memory device 1 to execute an erase operation (step S11). Then, the semiconductor memory device 1 executes the erase operation for a block BLK which is selected by the memory controller 2.

Subsequently, the memory controller 2 instructs the semiconductor memory device 1 to execute a weak write operation (step S12). Then, the semiconductor memory device 1 executes the weak write operation by selecting any one of the word lines WL included in the block BLK for which the erase operation was executed previously.

Here, the weak write operation of the semiconductor memory device 1 is described in brief. The weak write operation is executed after the erase operation and is, for example, a write operation which does not include a verify operation.

Figure 27:
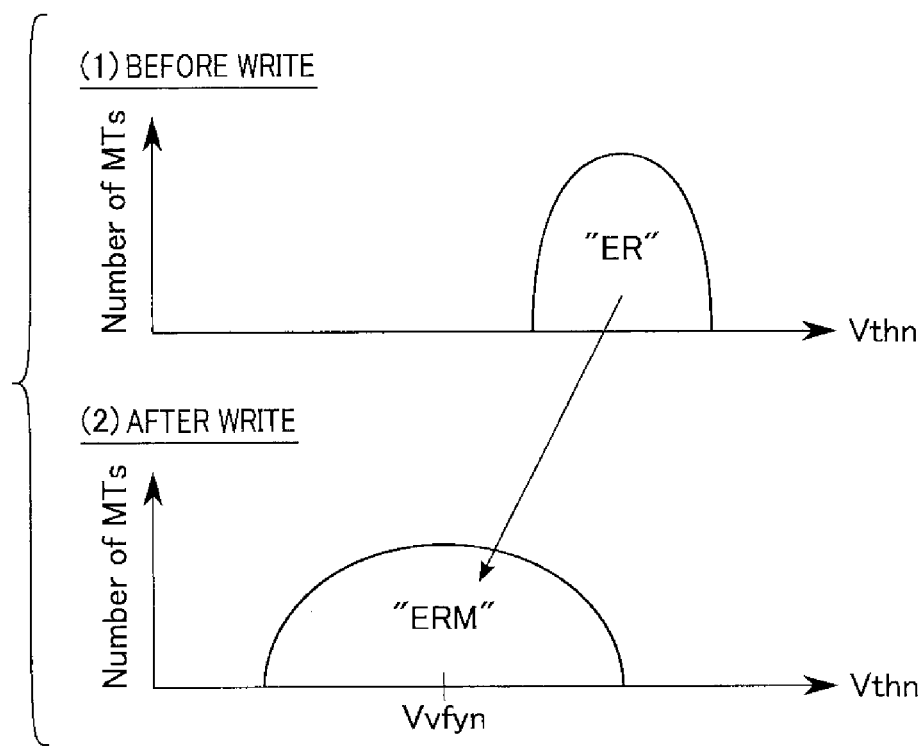
FIG. 27 is a threshold distribution diagram illustrating an example of a change of a threshold distribution of memory cell transistors before and after a weak write operation in the semiconductor memory device according to the third embodiment.

FIG. 27 illustrates an example of a change of the threshold distribution of memory cell transistors MT before and after the weak write operation in the semiconductor memory device 1 according to the third embodiment. As illustrated in part (1) of FIG. 27, the threshold voltages of memory cell transistors MT before the write operation are distributed in the "ER" state. On the other hand, after the weak write operation is executed, the threshold voltages decrease from the "ER" state to "ERM" state, as illustrated in part (2) of FIG. 27.

The "ERM" state is distributed, for example, near the "A" state, and has a greater width of distribution than the "ER" state. In addition, the "ERM" state extends across the verify voltage Vvfyn in the correction operation. This verify voltage Vvfyn corresponds to the erase verify voltage Vevfy. Specifically, when the weak write operation was executed, the distribution extending across the erase verify voltage Vevfy is formed from the threshold distribution of memory cell transistors MT distributed in the "ER" state.

Referring back to FIG. 26, after the weak write operation is executed, the memory controller 2 instructs the semiconductor memory device 1 to execute the NMOS read using, for example, an erase verify voltage Vevfy+Vdelta (step S13). The erase verify voltage Vevfy in the NMOS read corresponds to Vvfyn described with reference to FIG. 22.

Subsequently, the memory controller 2 instructs the semiconductor memory device 1 to execute the PMOS read using, for example, an erase verify voltage Vevfy (step S14). The erase verify voltage Vevfy in the PMOS read corresponds to Vvfyp described with reference to FIG. 22.

Then, based on the read results in steps S13 and S14, the memory controller 2 calculates an NP-FAIL number Nnpfail. Further, the memory controller 2 confirms whether Nnpfail is less than a predetermined number Nc or not (step S15).

If Nnpfail is not less than the predetermined number Nc (step S15, NO), the memory controller 2 steps up Vdelta (step S16). Concretely, a process of Vdelta=Vdelta+Vstep is executed. Vstep corresponds to the step-up voltage of Vdelta, and may be set to a freely selected numerical value.

After stepping up Vdelta, the memory controller 2 returns to step S13, and executes once again the NMOS read in step S13 and the PMOS read in step S14.

If the process of steps S13 to S16 is repeated and the Nnpfail becomes less than the predetermined number Nc (step S15, YES), the memory controller 2 sets the Vdelta as the correction value of $\Delta np$ (step S17).

As described above, the semiconductor memory device 1 according to the third embodiment can calculate the correction value of $\Delta np$ by executing the correction operation based on the instruction of the memory controller 2. In the above description, although the correction operation based on the instruction of the memory controller 2 was described, the above-described correction operation may be executed in the inside of the semiconductor memory device 1.

In addition, in the above description, the case was described in which the semiconductor memory device 1 executes the weak write operation before the correction operation, but the embodiment is not limited to this. For example, the verify voltage Vvfy used in the correction operation may be preset in the neighborhood of the center of the "ER" state. In this case, too, the semiconductor memory device 1 according to the third embodiment can obtain the correction value of $\Delta np$, as described above.

(Execution Timing of the Correction Operation)

Next, an example of the execution timing of the above-described correction operation will be described. The correction operation may be executed at a time of a defect inspection before shipment of the semiconductor memory device 1, or may be executed after the shipment.

When the correction operation is executed before the shipment of the semiconductor memory device 1, a manufacturer of the semiconductor memory device 1 causes the semiconductor memory device 1 before shipment to execute the correction operation for, for example, all blocks BLK, and to update the correction value of $\Delta np$.

Examples of the execution timing of the correction operation of the semiconductor memory device 1 after the shipment of the semiconductor memory device 1 will be described with reference to FIG. 28 and FIG. 29.

Figure 28:
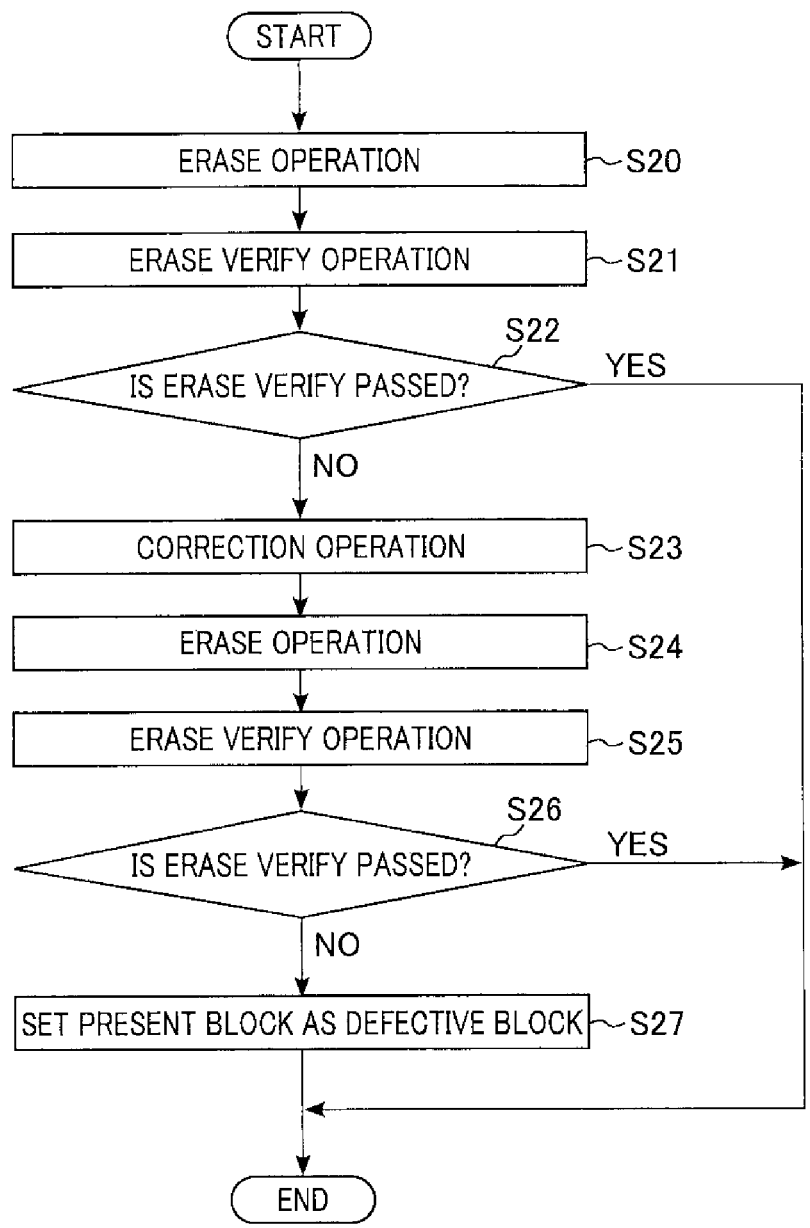
FIG. 28 is a flowchart illustrating an example of an execution timing of the correction operation in the semiconductor memory device according to the third embodiment.
Figure 29:
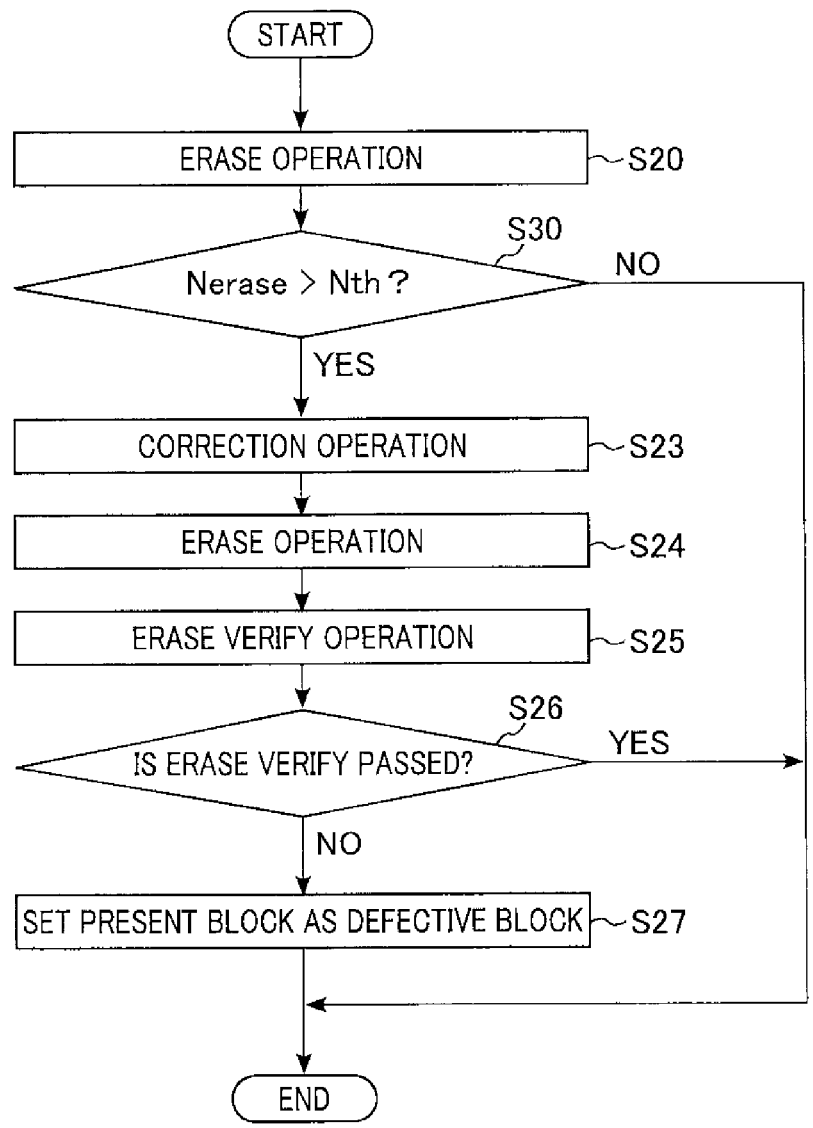
FIG. 29 is a flowchart illustrating an example of the execution timing of the correction operation in the semiconductor memory device according to the third embodiment.

FIG. 28 and FIG. 29 are flowcharts illustrating examples of the execution timing of the correction operation in the semiconductor memory device 1 according to the third embodiment.

In the example illustrated in FIG. 28, the semiconductor memory device 1 executes the correction operation, based on a failure in the erase verify operation.

Concretely, to start with, the memory controller 2 instructs the semiconductor memory device 1 to execute the erase operation, and the semiconductor memory device 1 executes the erase operation (step S20). Next, the memory controller 2 instructs the semiconductor memory device 1 to execute the erase verify operation in the block BLK on which the erase operation was executed in step S20, and the semiconductor memory device 1 executes the erase verify operation (step S21). Then, the memory controller 2 confirms whether the erase verify operation is passed or not, in the erase verify operation in step S21 (step S22).

When the erase verify is passed (step S22, YES), the memory controller 2 does not execute the correction operation for the block BLK. On the other hand, when the erase verify is failed (step S22, NO), the memory controller 2 executes the correction operation described with reference to FIG. 26. Note that in the correction operation executed in step S22, the erase operation in step S11 and the weak write operation in step S12 may be omitted.

If the correction operation in step S23 is completed, the memory controller 2 causes the semiconductor memory device 1 to execute once again the erase operation for the block BLK which failed the erase verify (step S24). Then, the memory controller 2 executes the erase verify operation using the correction value of $\Delta np$ calculated in step S23, in the block BLK on which the erase operation was executed in step S24 (step S25). Subsequently, the memory controller 2 confirms whether the erase verify operation is passed or not, in the erase verify operation in step S25 (step S26).

When the erase verify is passed (step S26, YES), the memory controller 2 terminates the correction operation of $\Delta np$ for the block BLK. On the other hand, when the erase verify is failed (step S26, NO), the memory controller 2 sets the block BLK as a defective block (step S27). Then, the memory controller 2 terminates the correction operation for the block BLK.

In the example illustrated in FIG. 29, the semiconductor memory device 1 executes the correction operation, based on the number of times of erase.

Concretely, the process of step S20 is first executed, and the semiconductor memory device 1 executes the erase operation. Next, the memory controller 2 confirms whether an erase number Nerase that is the number of times of erase in the block BLK, for which the erase operation was executed in step S20, exceeds a predetermined number Nth (step S30).

When the erase number Nerase does not exceed the predetermined number (step S30, NO), the memory controller 2 does not execute the correction operation for the block BLK. When the erase number Nerase exceeds the predetermined number (step S30, YES), the memory controller 2 advances to step S23 and executes the correction operation for the block BLK. After the process of step S23, the memory controller 2 executes, as needed, the operations of steps S24 to S27, like the operations described with reference to FIG. 28, and terminates the correction operation for the block BLK.

In FIG. 29, the case is illustrated in which the execution timing of the correction operation is set such that the correction operation is executed each time the erase number Nerase exceeds the predetermined number Nth, but the embodiment is not limited to this. For example, the memory controller 2 may execute the correction operation when the number of times of execution of the erase operation corresponds to a predetermined cycle, after the erase operation for a certain block BLK reached a predetermined number of times.

As described above, the semiconductor memory device 1 according to the third embodiment can execute the correction operation at a predetermined timing by properly setting a trigger relating to the execution of the correction operation.

[3-3] Advantageous Effects of the Third Embodiment

As described above, the semiconductor memory device 1 according to the third embodiment executes the correction operation of the erase verify voltage. By the correction of the erase verify, the precision of the erase verify operation can be enhanced.

As a result, the semiconductor memory device 1 according to the third embodiment can suppress the occurrence of an error due to a decrease in precision of the erase verify operation. Therefore, the semiconductor memory device 1 according to the third embodiment can enhance the reliability of data that is stored.

The above description is based on the assumption that $\Delta np$ is a constant value. In actual devices, however, it is estimated that there is a variance of $\Delta np$ among memory cell transistors MT.

FIG. 30 illustrates threshold distributions of memory cell transistors MT, which correspond to NMOS read and PMOS read, and illustrates an example of a variance of $\Delta np$.

As illustrated in FIG. 30, a case in which $\Delta np$ is large and a case in which $\Delta np$ is small can be considered. For example, when $\Delta np$ is large, a memory cell transistor MT that failed the NMOS read may also fail the PMOS read. When $\Delta np$ is small, a memory cell transistor MT that passed the NMOS read may also pass the PMOS read.

Thus, even if the correction amount of $\Delta np$ is set at an optimal value (central value), equations, N-PASS∩P-PASS=0 and N-FAIL ∩P-FAIL=0, cannot be satisfied at the same time due to the variance of $\Delta np$.

In the actual operation, the main object is to determine, in the PMOS read, that threshold voltages in the NMOS operation are the verify voltage Vvfyn or more. In other words, it is preferable that all memory cell transistors MT, which are included in region indicated by a white blank in the NMOS read, are included in a region indicated by hatching in the PMOS read. Specifically, it is preferable that priority is put on dealing with the memory cell transistors MT with large $\Delta np$.

As regards this, in the semiconductor memory device 1 according to the third embodiment, priority is put on N-FAIL∩P-FAIL, and the $\Delta np$, with which NP-FAIL becomes sufficiently small, is searched, as described with reference to FIG. 26.

As a result, although the margin decreases by a degree corresponding to $\Delta np$, the semiconductor memory device 1 according to the third embodiment can determine, in the PMOS read, the memory cell transistors MT having threshold voltages of a certain value or more in the NMOS read.

In this manner, the semiconductor memory device 1 according to the third embodiment can calculate a proper correction value of $\Delta np$, and can enhance the precision of the erase verify operation.

[4] Other Modifications, Etc

The semiconductor memory device of each embodiment includes a string, a bit line, a well line and a sequencer. The string <e.g. reference sign NS in FIG. 12> includes a first select transistor <e.g. reference sign ST1 in FIG. 12>, a second select transistor <e.g. reference sign ST2 in FIG. 12>, and a plurality of memory cell transistors <e.g. reference signs MT0 to MT7 in FIG. 12> which are connected in series between the first select transistor and the second select transistor, and each of which uses a ferroelectric material for a memory layer. The bit line <e.g. reference sign BL in FIG. 12> is connected to the first select transistor. The well line <e.g. reference sign CPWELL in FIG. 12> is connected to the second select transistor. At a first time instant in the erase verify operation after the erase operation with the string selected, the sequencer applies a first voltage <e.g. reference sign Vevfy in FIG. 12> to the gate of the memory cell transistor, applies a second voltage <e.g. reference sign Vsgrp in FIG. 12>, which is lower than the first voltage, to the gate of the first select transistor, applies a third voltage <e.g. reference sign Vsgrp in FIG. 12>, which is lower than the first voltage, to the gate of the second select transistor, applies a fourth voltage <e.g. reference sign Vsrc in FIG. 12> to the bit line, and applies a fifth voltage <e.g. reference sign Vbl+Vsrc in FIG. 12>, which is higher than the fourth voltage, to the source line. Thereby, the semiconductor memory device according to the embodiment can improve the erase performance of the FeNAND.

In the erase verify operation described in the above embodiments, the case was illustrated in which the same voltage is applied to all word lines WL in the selected block BLKsel. However, verify voltages, which are applied to the word lines WL in the selected block BLKsel, may be different.

For example, in the NAND flash memory in which memory cell transistors MT are stacked three-dimensionally, there is a case in which effective voltages, which are applied to the memory cell transistors MT, are different in accordance with layer positions of the word lines WL. In connection with this, the semiconductor memory device 1 may apply correction values, which are based on the layer positions, to the voltages that are applied to the word lines WL.

In other words, in the erase verify operation, the semiconductor memory device 1 may apply an optimized verify voltage to each word line WL, based on the layer position of the word line WL. Thereby, the semiconductor memory device 1 can suppress a variance of characteristics corresponding to the positions of memory cell transistors MT, and can enhance the reliability of data.

In the above embodiments, the structure of the memory cell array 10 may be a different structure. For example, the memory pillar MP may have such a structure that a plurality of pillars are coupled in the Z direction. Concretely, the memory pillar MP may have such a structure that a pillar penetrating the conductor layers 24 (select gate lines SGD) and a pillar penetrating the conductor layers 23 (word lines WL) are coupled, or may have such a structure that a plurality of pillars, which penetrate the conductor layers 23 (word lines WL), respectively, are coupled in the Z direction.

In the above embodiments, the case was illustrated in which the memory cell array 10 is formed on the P-well region 20. However, the semiconductor memory device 1 may have such a structure that a circuit, such as the sense amplifier module 16, is disposed under the memory cell array 10. In this case, a lower part of the memory pillar MP is electrically connected to, for example, a P-type conductor layer which functions as the source line CELSRC.

In the above embodiments, the structure in which the memory cell transistors MT provided in the memory cell array 10 are stacked three-dimensionally was described by way of example, but the embodiments are not limited to this. For example, the structure of the memory cell array 10 may be the structure of a planar NAND flash memory in which memory cell transistors MT are arranged two-dimensionally. In this case, too, the above embodiments can be implemented, and the same advantageous effects can be obtained.

In the present specification, the term "connection" means an electrical connection, and does not exclude a connection with another element being interposed. In addition, in this specification, the term "OFF state" means that a voltage less than a threshold voltage of an associated transistor is applied to the gate of this transistor, and does not exclude a state in which a small current, such as a leak current of a transistor, flows.

In the present specification, the term "conductivity type" means an N type or a P type. For example, a first conductivity type corresponds to the P type, and a second conductivity type corresponds to the N type.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a semiconductor substrate including:
      a well region having a first semiconductor type; and
      a diffusion region formed in the well region, the diffusion region having a second semiconductor type different from the first semiconductor type:
   a first conductor layer disposed above the semiconductor substrate;
   a plurality of second conductor layers disposed between the first conductor layer and the semiconductor substrate, and alternately stacked with insulator layers;
   a third conductor layer disposed between the second conductor layers and the semiconductor substrate;
   a semiconductor pillar extending in a first direction through the first conductor layer, the second conductor layers, and the third conductor layer to reach the well region;
   a ferroelectric film covering a side surface of the semiconductor pillar and extending in the first direction to intersect with the second conductor layers;
   a bit line connected to the semiconductor pillar;
   a source line connected to the diffusion region; and
   a sequencer,
   wherein
   the first conductor layer and a corresponding part of the semiconductor pillar form a first select transistor,
   each of the second conductor layers, a corresponding part of the ferroelectric film, and a corresponding part of the semiconductor pillar form a memory cell transistor,
   the third conductor layer and a corresponding part of the semiconductor pillar form a second select transistor,
   the first select transistor, the memory cell transistors, and the second select transistor form a string,
   the memory cell transistors include a first memory cell transistor, and
   the sequencer is configured to:
      execute an erase operation with the string being selected;
      execute an erase verify operation after the erase operation;
      apply a first voltage to the first memory cell in the erase verify operation;
      execute, after the erase verify operation, NMOS read of the first memory cell transistor and PMOS read of the first memory cell transistor; and
      correct a value of the first voltage, based on a result of the NMOS read and a result of the PMOS read.

2. The device of claim 1,
   wherein at a first instant in the erase verify operation, the sequencer is configured to supply the first voltage to a gate of at least one of the memory cell transistors, to apply a second voltage, which is lower than the first voltage, to a gate of the first select transistor, to apply a third voltage, which is lower than the first voltage, to a gate of the second select transistor, to apply a fourth voltage to the bit line, and to apply a fifth voltage, which is higher than the fourth voltage, to the source line.

3. The device of claim 2,
   the string further includes a dummy transistor connected between the first select transistor and the second select transistor, and
   the sequencer is configured to apply, at the first time instant in the erase verify operation, a sixth voltage, which is lower than the first voltage, to a gate of the dummy transistor.

4. The device of claim 3, wherein the sixth voltage is lower than the fifth voltage.

5. The device of claim 2, wherein at the first time instant, the sequencer is configured to apply the first voltage to each of gates of the memory cell transistors.

6. The device of claim 2, wherein the second voltage is lower than the fifth voltage.

7. The device of claim 2, wherein the third voltage is lower than the fifth voltage.

8. The device of claim 2, wherein the second voltage is substantially equal to the third voltage.

9. The device of claim 2, further comprising:
   a fourth conductor layer disposed above the semiconductor substrate and extending in parallel with the first conductor layer;
   a second semiconductor pillar extending in the first direction through the fourth conductor layer, the second conductor layers, and the third conductor layer to reach the well region; and
   a second ferroelectric film covering a side surface of the second semiconductor pillar and extending in the first direction to intersect with the second conductor layers,
   wherein
   the fourth conductor layer and a corresponding part of the second semiconductor pillar form a third select transistor,
   each of the second conductor layers, a corresponding part of the second ferroelectric film, and a corresponding part of the second semiconductor pillar form a second memory cell transistor,
   the third conductor layer and a corresponding part of the second semiconductor pillar form a fourth select transistor, and
   the third select transistor, the second memory cell transistors, and the fourth select transistor form a second string.

10. The device of claim 9, wherein at a second time instant in an erase verify operation after an erase operation in which the string is selected and the second string is unselected, the sequencer is configured to apply a seventh voltage, which is equal to or higher than the fifth voltage, to the fourth conductor layer.

11. The device of claim 10, further comprising:
a first block and a second block each including the string and the second string,
wherein at a third time instant in an erase verify operation after an erase operation in which the first block is selected and the second block is unselected, the sequencer is configured to apply the fourth voltage to a gate of the first select transistor in the second block, and to apply the fifth voltage to a gate of the second select transistor in the second block.

12. The device of claim 11, wherein at the third time instant, a gate of each of a plurality of memory cell transistors in the second block is set in a floating state.

13. The device of claim 12, wherein hole conduction is used in the erase verify operation.

14. The device of claim 1, wherein one of the memory cell transistors is set to a first threshold voltage when the one of the memory cell transistors stores first data corresponding to an erase state, and the one of the memory cell transistors is set to a second threshold voltage, which is lower than the first threshold voltage, when the one of the memory cell transistors stores second data corresponding to a state in which data is written.

15. The device of claim 1, wherein the sequencer is configured to calculate a correction value, based on whether or not a number of a part of the memory cell transistors, which are set in an OFF state in both the NMOS read and the PMOS read, is lower than a predetermined number, and to correct the value of the first voltage, based on the correction value.

16. The device of claim 1, wherein the sequencer is configured to execute, after the erase operation, a write operation with the first memory cell transistor being selected, before executing the NMOS read and the PMOS read.

17. The device of claim 1, wherein the write operation does not include a verify operation.

18. The device of claim 1, further comprising:
a sense amplifier connected to the bit line,
wherein the sense amplifier including:
a first transistor including a first end connected to the bit line;
a second transistor including a first end connected to a second end of the first transistor;
a third transistor including a first end connected to a second end of the second transistor;
a fourth transistor including a first end connected to the second end of the second transistor and the first end of the third transistor and a gate connected to the first end of the second transistor; and
a capacitor including a first end connected to a second end of the third transistor.

19. The device of claim 18, wherein
at a first time instant in the erase verify operation, the sequencer is configured:
to apply the first voltage to a gate of at least one of the memory cell transistors,
to apply a second voltage, which is lower than the first voltage, to a gate of the first select transistor,
to apply a third voltage, which is lower than the first voltage, to a gate of the second select transistor,
to apply a fourth voltage to the bit line,
to apply a fifth voltage, which is higher than the fourth voltage, to the source line, and
to apply a sixth voltage to a gate of the second transistor to thereby turn on the second transistor; and
at a second time instant after the first time instant, the sequencer is configured:
to apply a seventh voltage to the gate of the second transistor to thereby turn off the second transistor, and
to apply an eighth voltage to a gate of the third transistor to thereby turn on the third transistor.

* * * * *